(12) United States Patent
Ishihara et al.

(10) Patent No.: US 8,928,109 B2
(45) Date of Patent: Jan. 6, 2015

(54) SEMICONDUCTOR DEVICE

(75) Inventors: Takashi Ishihara, Tokyo (JP); Hisayuki Nagamine, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 415 days.

(21) Appl. No.: 13/474,684

(22) Filed: May 17, 2012

(65) Prior Publication Data

US 2012/0319228 A1    Dec. 20, 2012

(30) Foreign Application Priority Data

Jun. 15, 2011    (JP) .................................. 2011-132852

(51) Int. Cl.
*H01L 23/52* (2006.01)
*H01L 27/02* (2006.01)

(52) U.S. Cl.
CPC .................................. *H01L 27/0292* (2013.01)
USPC ........... 257/503; 257/328; 257/355; 257/357; 257/656; 257/734

(58) Field of Classification Search
CPC .. H01L 23/60; H01L 27/0248; H01L 27/0292
See application file for complete search history.

(56) References Cited

U.S. PATENT DOCUMENTS

| | | | |
|---|---|---|---|
| 6,756,834 B1 | 6/2004 | Tong et al. | |
| 7,109,533 B2 * | 9/2006 | Kodama | ........................ 257/173 |
| 2003/0235019 A1 | 12/2003 | Ker et al. | |
| 2007/0091522 A1 | 4/2007 | Chen | |
| 2008/0080107 A1 | 4/2008 | Chow et al. | |

FOREIGN PATENT DOCUMENTS

| | | |
|---|---|---|
| GB | 2 451 439 A | 2/2009 |
| JP | 2011-061232 A | 3/2011 |

OTHER PUBLICATIONS

European Search Report dated Aug. 22, 2012.

\* cited by examiner

*Primary Examiner* — Kyoung Lee
(74) *Attorney, Agent, or Firm* — McGinn IP Law Group, PLLC

(57) ABSTRACT

A semiconductor device is disclosed, which includes first and second power supply pads supplied with first and second power voltages, respectively, a first protection circuit coupled between the first and second power supply pads, and an internal circuit including a first power line and a plurality of transistors electrically coupled to the first power line. The first power line includes first and second portions, and the first portion is electrically connected to the first power supply pad. The device further includes a second protection circuit coupled between the second portion of the first power line and the second power supply pad.

20 Claims, 28 Drawing Sheets

SEMICONDUCTOR DEVICE

This application is based upon and claims the benefit of priority from Japanese patent application No. 2011-132852, filed on Jun. 15, 2011, the disclosure of which is incorporated herein in its entirety by reference.

BACKGROUND OF THE INVENTION

1. Field of the Invention

The present invention relates to a semiconductor device, and more particularly to a semiconductor device including a protective element (electrostatic protective element) for protection against electrostatic discharges (ESD).

2. Description of the Related Art

In recent years, with increased miniaturization of semiconductor devices, there is a greater likelihood that minute levels of electrostatic energy will destroy these devices. Under the circumstances, attention has been drawn to ESD-related technologies for protecting internal circuits that are made up of semiconductor devices.

In order to prevent a large current due to an ESD surge from flowing into an internal circuit, which makes semiconductor devices, connected to pads, it has been customary in the art to protect the internal circuit with ESD protective elements that are disposed near the pads (see JP2011-61232A).

However, the inventors of the present invention have found a problem that, when ESD surges occur successively, electric charges that are caused by the ESD surges tend to be stored in the internal circuit without being released from the internal circuit through the ESD protective elements. The problem will be described in detail below.

According to the product specifications for some semiconductor devices, power supply pads are separate from each other for various reasons including potential differences, noise suppression, etc.

FIG. 1A shows the package of a prototype semiconductor device that the inventors have conceived in the course of making the present invention. In FIG. 1, power supply voltages VDD and VSS, which are used for peripheral circuits, and power supply voltages VDDL and VSSDL, which are used for DLL (Delay Locked Loop) circuits, are separate from each other. The power supply voltage VSS represents a ground potential. Therefore, the ground potential is also referred to as ground potential VSS. The semiconductor device may be a semiconductor storage device including a DRAM.

In FIG. 1A, VDD pad 1011 and VSS pad 1012 are pads for external power supplies used by the peripheral circuits. VDDL pad 1013 and VSSDL pad 1014 are pads for external power supplies that are dedicated to the DLL circuits.

In the semiconductor device shown in FIG. 1A, the power supplies used by the peripheral circuits and the power supplies dedicated to the DLL circuits have identical potentials, but are separate from each other for noise suppression. Therefore, VDD pad 1011 and VDDL pad 1013 are separate from each other, and VSS pad 1012 and VSSDL pad 1014 are separate from each other.

FIG. 1B shows a chip incorporated in the package of the prototype semiconductor device. The chip will be described below with reference to FIG. 1B.

As shown in FIG. 1B, the chip includes VDD pads 101 connected to VDD pad 1011 of the package, VDDL pad 103 connected to VDDL pad 1013 of the package, VSS pads 102 connected to VSS pad 1012 of the package, VSSDL pad 104 connected to VSSDL pad 1014 of the package, DLL circuit area 105 where DLL circuits are located, array areas AR where memory arrays are located, and peripheral circuit areas 106 that control signals input to and output from DQ pads and ADDRESS pads. DLL circuit area 105 where DLL circuits are located is isolated from substrate P-sub by deep N well layer DNW to prevent noise produced in DLL circuit area 105 from being propagated from VSSKL pad 104 via substrate P-sub to VSS pads 102 and to circuits, e.g., peripheral circuits to be described later, connected to VSS pads 102. VDDL pad 103 and VDD pads 101 are disposed independently of each other. Pads which are not particularly denoted in FIGS. 1A and 1B are assigned as DQ pads, ADDRESS pads, and power supply pads other than VDDL and VSSDL pads, and will not be described in detail below as they have no direct bearing on the present invention.

The peripheral circuits, which are connected to VDD pads 101 and VSS pads 102, are located in peripheral circuit areas 106 which are not enclosed by deep N well layer DNW. Only DLL circuits are connected to VDDL pad 103 and VSSDL pad 104. VSS pads 102 are kept at ground potential VSS supplied from a ground electrode. Since VSS pads 102 are connected to substrate P-sub, substrate P-sub is also kept at ground potential VSS.

FIG. 2A shows circuits in the prototype semiconductor device shown in FIGS. 1A and 1B, and FIG. 2B shows the layout of DLL circuit B in the semiconductor device shown in FIG. 2A. ESD protective elements (hereinafter simply referred to as "protective elements") disposed near pads will be described below with reference to FIGS. 2A and 2B. In FIG. 2B, attention is directed to protective element A1 for the sake of brevity, with other protective elements being omitted from illustration.

The semiconductor device includes VDD pad 101, VSS pad 102, VDDL pad 103, VSSDL pad 104, protective elements A1 through A5, DLL circuit B in DLL circuit area 105, peripheral circuit 106A in peripheral circuit area 106, ground electrode T, and interconnects S1 through S8. Ground electrode T is connected by interconnect S8 to VSS pad 102 which supplies the ground potential. DLL circuit B is located in DLL circuit area 105. DLL circuit B is supplied with VDDL, e.g., power supply potential VDD, and VSSL, e.g., ground potential VSS, through interconnect S1 and through interconnect S2. Interconnect S1 is disposed in DLL circuit area 105 and connected to interconnect S3 that interconnects DLL circuit arca 105 and VDDL pad 103. Interconnect S2 is disposed in DLL circuit area 105 and connected to interconnect S4 that interconnects DLL circuit area 105 and VSSDL pad 104.

DLL circuit B is constructed of a plurality of internal circuits, e.g., internal circuits B1 and B2. Internal circuit B1 includes a plurality of PMOS transistors PMOS, a plurality of NMOS transistors NMOS, interconnect S1a functioning as interconnect S1 in internal circuit B1, and interconnect S2a functioning as interconnect S2 in internal circuit B1. Similarly, internal circuit B2 includes a plurality of PMOS transistors PMOS, a plurality of NMOS transistors NMOS, interconnect S1b functioning as interconnect S1 in internal circuit B2, and interconnect S2b functioning as interconnect S2 in internal circuit B2. Interconnect S1 is made up of interconnect S1a and interconnect S1b, and interconnect S2 is made up of interconnect S2a and interconnect S2b. Interconnect S3 interconnects VDDL pad 103 and interconnect S1. Interconnect S4 interconnects VDDL pad 104 and interconnect S2.

Peripheral circuit 106A includes a plurality of PMOS transistors PMOS, a plurality of NMOS transistors NMOS, interconnect S5 for VDD, and interconnect S6 for VSS. Interconnect S7 interconnects VDD pad 101 and interconnect S5. Interconnect S8 interconnects VSS pad 102 and interconnect S6.

Generally, protective elements are disposed near pads and disposed between pads and internal circuits, and comprise a diode-connected transistor.

In FIG. 2A, protective elements that are connected to VDDL pad 103 include protective element A1 and protective element A2. Protective element A1 has a source and a drain which are connected respectively to ground electrode T and VDDL pad 103. Protective element A2 has a source and a drain which are connected respectively to VSSDL pad 104 and VDDL pad 103.

Resistor R1 represents a parasitic resistor from VDDL pad 103 to internal circuit B1. Resistor R2 represents a parasitic resistor from VDDL pad 103 to internal circuit B2. Electric charge Q1 represents an electric charge stored in internal circuit B1. Electric charge Q2 represents an electric charge stored in internal circuit B2.

As shown in FIG. 2B, functional cells C represent circuit units each having a small-scale function. Functional blocks D1 through D4 represent circuits each having a particular function performed by a combination of functional cells C. Power supply lines CS11, CS21, CS31, CS41, CS51 and CS61 supply adjacent functional cells C with power supply voltage VDDL that is supplied from VDDL pad 103 through interconnect S1. Power supply lines CS12, CS22, CS32, CS42, CS52 and CS62 supply adjacent functional cells C with power supply voltage VSSDL that is supplied from VSSDL pad 104 through interconnect S2.

FIG. 2C shows in cross section DLL circuit B which is isolated by deep N well layer DNW from substrate P-sub that is supplied with potential VSS. Since DLL circuit B is isolated by deep N well layer DNW from substrate P-sub, DLL circuit B is not connected to ground electrode T under potential VSS.

Principles of operation of the protective elements will be described below.

FIG. 3 shows in cross section protective element A1. FIG. 4 shows an Id-Vd characteristic curve of protective element A1. Operation of protective element A1 will be described below with reference to FIGS. 3 and 4. In FIGS. 3 and 4, VSS represents ground potential.

When a voltage is applied to VDDL pad 103 that is connected to drain Drain of protective element A1, drain voltage Vd of protective element A1 increases. When drain voltage Vd reaches voltage Vd0 shown in FIG. 4, a current flows from drain Drain to subcontact E1 through P well layer P-Well. Such a current path will be referred to as path F1 in protective element A1.

Thereafter, the voltage of P well layer P-Well near source Source of protective element A1 rises due to the current flowing through the parasitic resistor in P well layer P-Well. When the voltage between P well layer P-Well and source Source exceeds a certain level, the PN junction between P well layer P-Well and source Source is forward-biased, thereby producing a low-resistance current path from drain Drain to source Source. Such a current path will be referred to as path F2 in protective element A1.

This phenomenon is known as snapback. Voltage Vd1 where snapback occurs is referred to as a trigger voltage.

When snapback occurs in protective element A1, the current from VDDL pad 103 is discharged through path F2 into ground electrode T, thereby reducing the current flowing from VDDL pad 103 into DLL circuit B. Before snapback occurs, the current from VDDL pad 103 also flows into DDL circuit B.

Examples of ESD-applied pulses will be described below.
FIGS. 5A through 5D show typical models of ESD-applied pulses.

FIG. 5A shows package-charged model CDM in which a large current flows at a high speed.

FIG. 5B shows machine model MM in which a current having a medium amplitude flows.

FIG. 5C shows human body model HBM in which a small current flows.

Circuit operation according to the related art, upon application of an HBM pulse, will be described below with reference to FIGS. 6A, 6B, and 7.

FIG. 6A shows an HBM pulse, and FIG. 6B shows currents flowing through current path G1 and through current path G2 shown in FIG. 7.

When the HBM pulse shown in FIG. 6A is applied to VDDL pad 103, currents flow respectively through current path G1 and current path G2. Current path G1 corresponds to path F1 shown in FIG. 3.

Since protective element A1 exhibits the Id-Vd characteristic curve shown in FIG. 4, a current flows from VDDL pad 103 through current path G2 into DLL circuit B prior to snapback (before protective operation starting time t1 shown in FIG. 6B).

Thereafter, when the voltage applied to protective element A1 exceeds the trigger voltage, snapback occurs.

When snapback occurs in protective element A1, a current abruptly starts to flow from VDDL 103 through protective element A1 into ground electrode T (after protective operation starting time t1 shown in FIG. 6B).

The current flowing into DLL circuit B is reduced, and the gate voltage of DLL circuit B does not exceed a gate withstand voltage of the DLL circuit B, which is thus prevented from suffering an ESD breakdown.

Storage of an electric charge in DLL circuit B will be described below.

Since Q=I·t, the amount of electric charge stored in DLL circuit B is equal to the area of region H1 shown in FIG. 6B.

A while after the protective operation stating time, the current flowing through current path G2 is drawn to protective element A1, and the direction of the current flowing through current path G2 is reversed (see FIG. 8).

Up to the point immediately before the direction of the current flowing through current path G2 is reversed, the electric charge is continuously stored in DLL circuit B, and the amount of the electric charge stored in DLL circuit B at this time is represented by the area of region H1 shown in FIG. 6B.

The reversal of the direction of the current flowing through current path G2 means that DLL circuit B is discharged. After DLL circuit discharge starting time t2 in FIG. 6B, the electric charges stored in DLL circuit B are discharged through protective element A1 into ground electrode T until finally they become nil.

At this time, the amount of electric charge stored in DLL circuit B is equal to the amount of electric charge discharged from DLL circuit B.

Problems with respect to the connection of protective elements according to the related art will be described below.

Actual semiconductor devices may not be subjected to a single pulse applied thereto as shown in FIG. 5A, 5B, or 5C, but to a succession of pulses applied thereto as shown in FIG. 9A, for example.

If a protective element is connected to a semiconductor device according to the related art, then the semiconductor device tends to suffer an ESD breakdown due to such a succession of pulses applied thereto. The mechanism of such an ESD breakdown will be described below.

When pulse I1 shown in FIG. 9A is applied to VDDL pad 103, an electric charge is initially stored in DLL circuit B by pulse I1, and is thereafter discharged through protective element A1 into ground electrode T.

When a succession of pulses shown in FIG. 9A is applied to VDDL pad 103, an electric charge is stored in DLL circuit B by the respective pulses and then discharged as shown in FIG. 9B. At this time, however, while an electric charge stored in DLL circuit B by each pulse is being discharged, a next pulse is applied to VDDL pad 103. For example, when pulse I2 is applied to VDDL pad 103, an electric charge stored in DDL circuit B by pulse I1 still remains undischarged.

Consequently, as shown in FIG. 9B, the amount of electric charge stored in DDL circuit B by pulse I2 in the duration thereof becomes greater than the amount of electric charge stored in DDL circuit B by pulse I1 in the duration thereof.

A path along which the electric charge stored in DDL circuit B is discharged will be described below with reference to FIG. 10.

In FIG. 10, the distance along the interconnect from VDDL pad 103 to interconnect S1b in internal circuit B2 is greater than the distance along the interconnect from VDDL pad 103 to interconnect S1a in internal circuit B1. Therefore, the resistance of resistor R2 is greater than the resistance of resistor R1.

The path along which electric charge Q1 stored in internal circuit B1 is referred to as discharge path J1, and the path along which electric charge Q2 stored in internal circuit B2 is referred to as discharge path J2.

Since the resistance of resistor R2 is greater than the resistance of resistor R1, electric charge Q1 is discharged more easily through discharge path J1 than electric charge Q2 is discharged through discharge path J2.

Therefore, the "electric charge that remains undischarged in the duration of pulse I1" in FIG. 9B is mostly the electric charge that is stored in internal circuit B2 at the time pulse I2 starts to be applied.

When a succession of ESD-induced pulses is applied to VDDL pad 103, the amount of electric charge stored in internal circuit B2, which is remotest from VDDL pad 103 among the connected internal circuits, progressively grows until finally the gate of internal circuit B is destroyed.

SUMMARY OF THE INVENTION

According to an embodiment of the present invention, a semiconductor device includes a power supply pad, a prescribed circuit including a power supply interconnect, a first interconnect interconnecting the power supply pad and the power supply interconnect, a second interconnect being set to a prescribed potential, a first electrostatic protective element providing a current path from the first interconnect to the second interconnect when the potential on the first interconnect reaches a first threshold value, and a second electrostatic protective element disposed between the power supply interconnect and the second interconnect, the second electrostatic protective element providing a current path from the power supply interconnect to the second interconnect when the potential on the first interconnect reaches a second threshold value.

According to another embodiment of the disclosure, three is provided a semiconductor device that includes: first and second power supply pads supplied with first and second power voltages, respectively; a first protection circuit coupled between the first and second power supply pads; an internal circuit including a first power line and a plurality of transistors electrically coupled to the first power line, the first power line including a first portion electrically connected to the first power supply pad and a second portion; and a second protection circuit coupled between the second portion of the first power line and the second power supply pad.

BRIEF DESCRIPTION OF THE DRAWINGS

FIG. 12 is a diagram showing the layout of a DLL circuit in the semiconductor device shown in FIG. 11;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Semiconductor devices according to preferred embodiments of the present invention will be described in detail below with reference to the drawings.

Figure 1A:
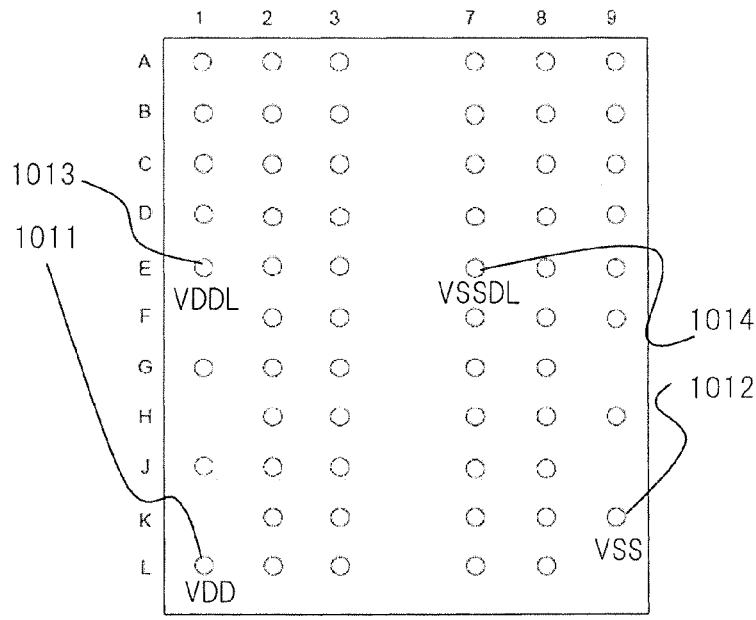
FIG. 1A is a plan view of the package of a prototype semiconductor device.
Figure 1B:
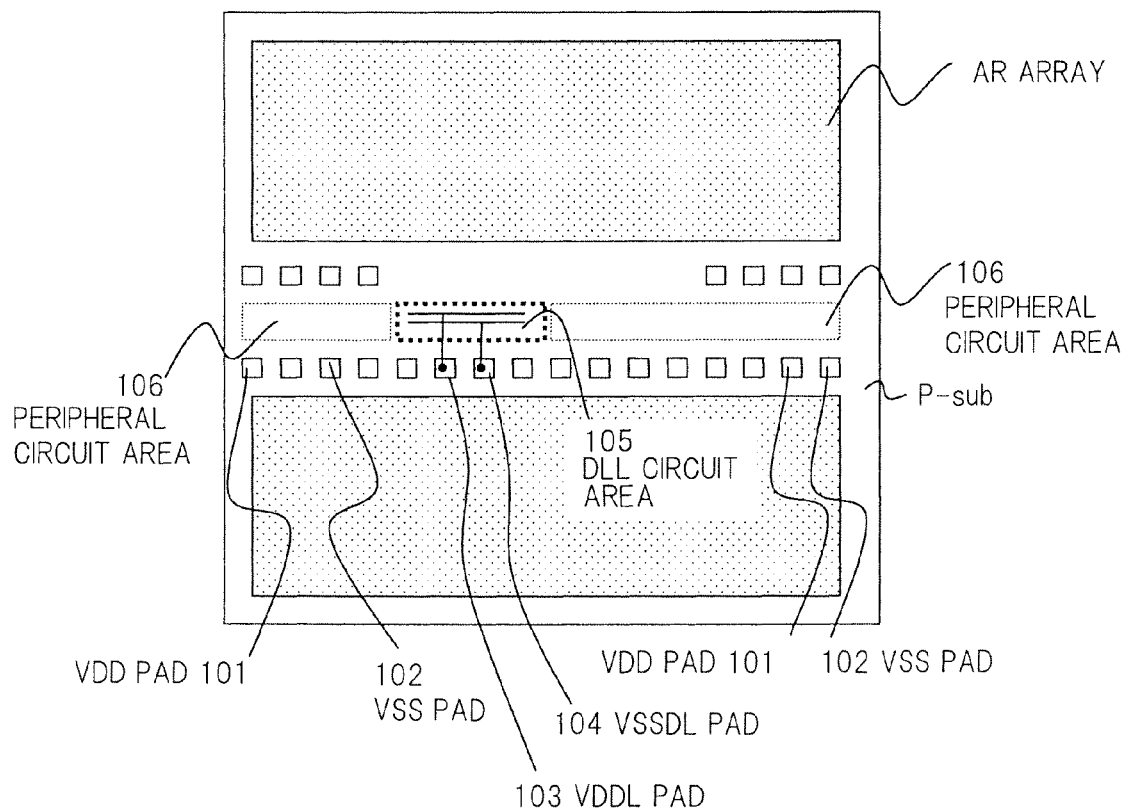
FIG. 1B is a plan view of a chip incorporated in the package of the prototype semiconductor device.
Figure 2A:
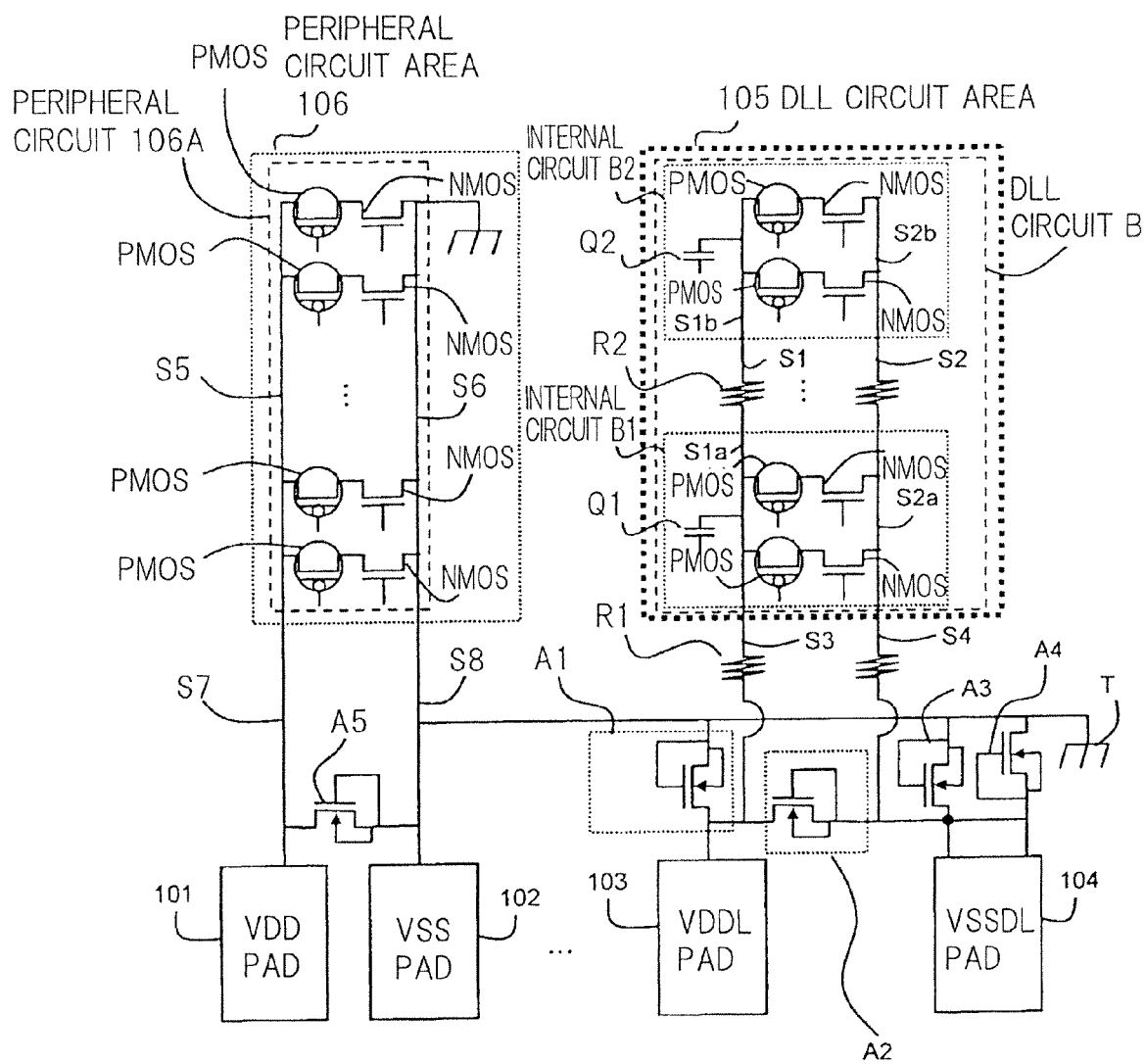
FIG. 2A is a circuit diagram of circuits in the prototype semiconductor device which includes protective elements.
Figure 2B:
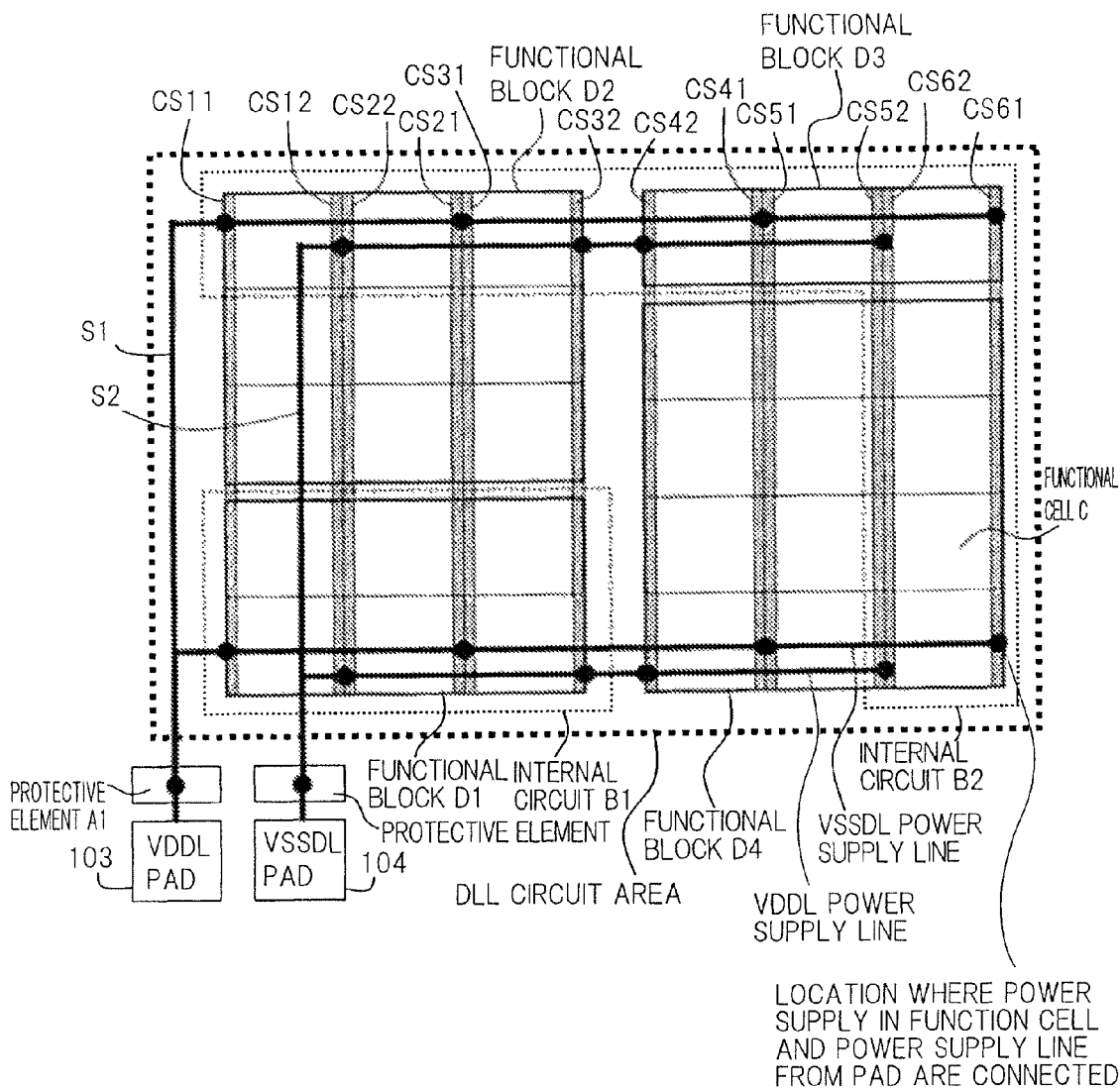
FIG. 2B is a diagram showing the layout of a DLL circuit in the semiconductor device shown in FIG. 2A.
Figure 2C:
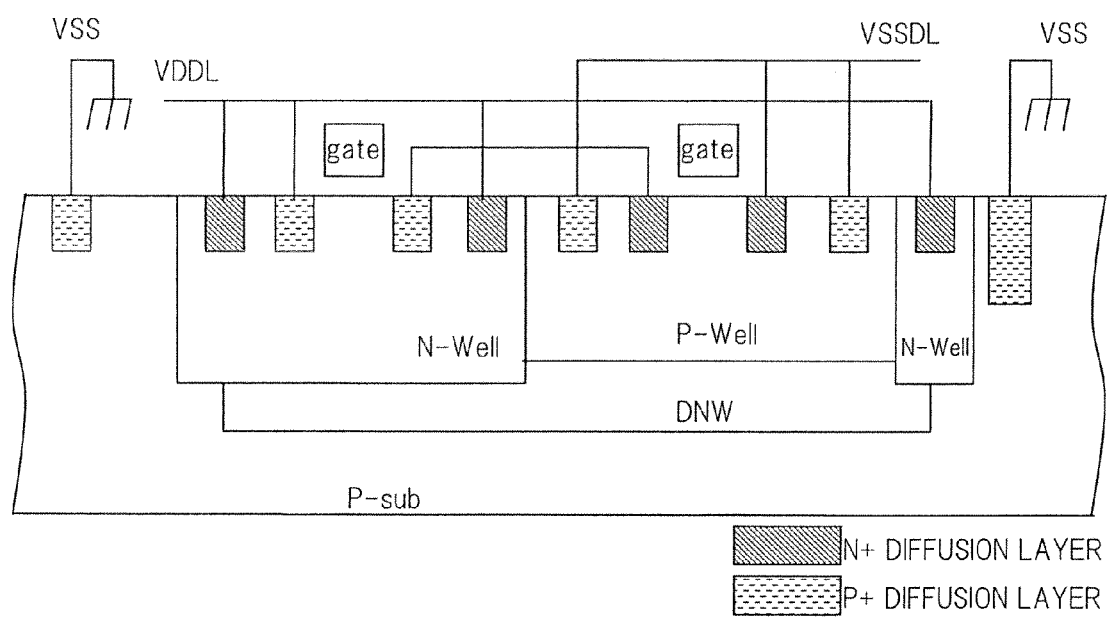
FIG. 2C is a cross-sectional view of the DLL circuit shown in FIG. 2B.
Figure 3:
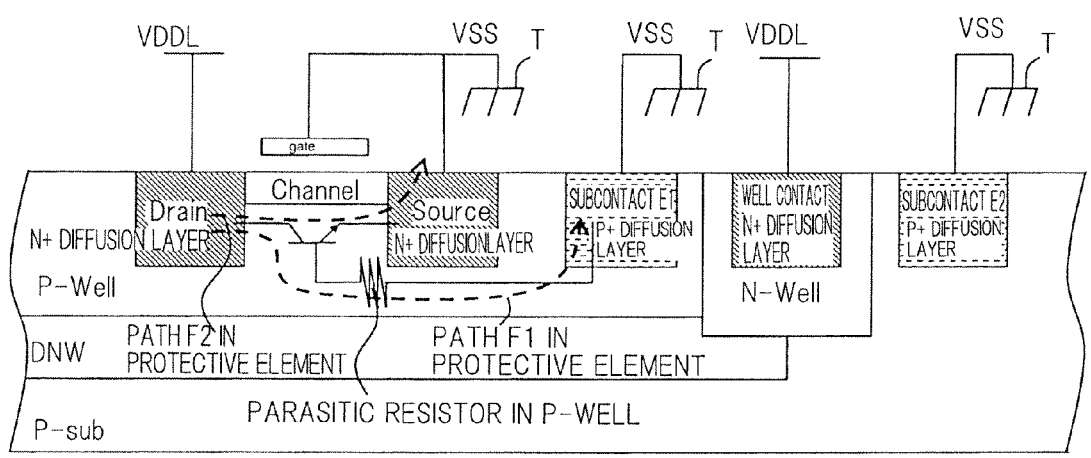
FIG. 3 is a cross-sectional view of a protective element.
Figure 4:
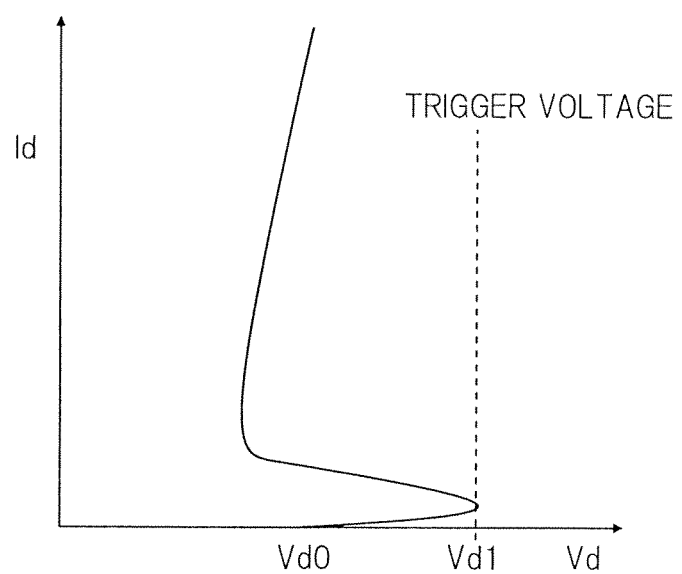
FIG. 4 is a diagram showing an Id-Vd characteristic curve of the protective element.
Figure 5A:
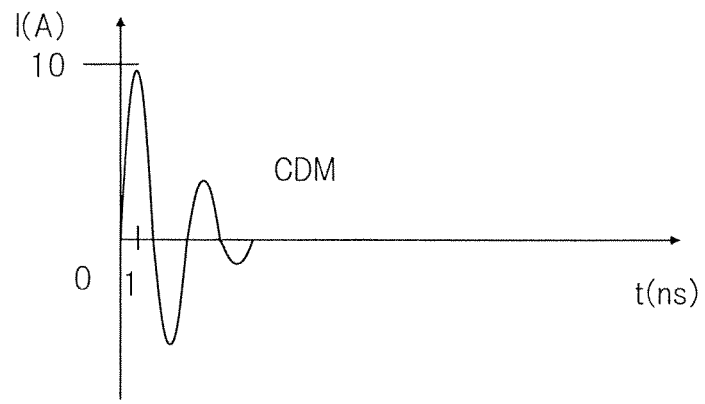
FIG. 5A is a diagram showing a package-charged model as a typical model of ESD-applied pulses.
Figure 5B:
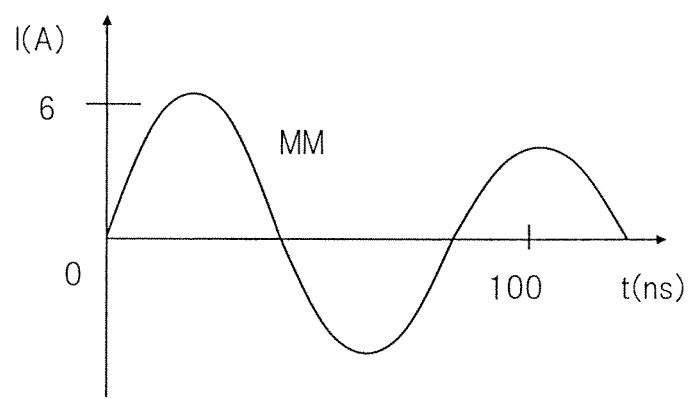
FIG. 5B is a diagram showing a machine model as atypical model of ESD-applied pulses.
Figure 5C:
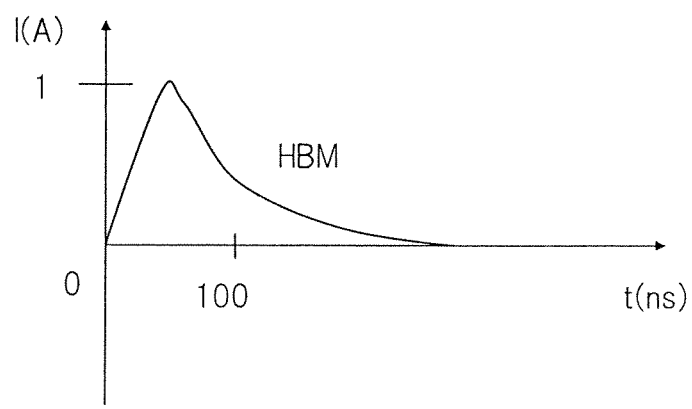
FIG. 5C is a diagram showing a human body model as a typical model of ESD-applied pulses.
Figure 6A:
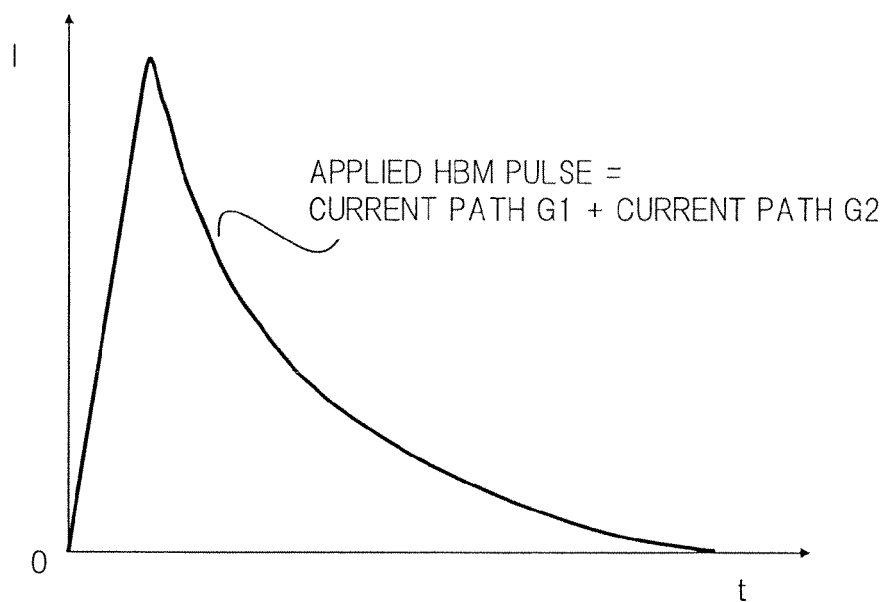
FIG. 6A is a diagram showing an ESD-applied pulse.
Figure 6B:
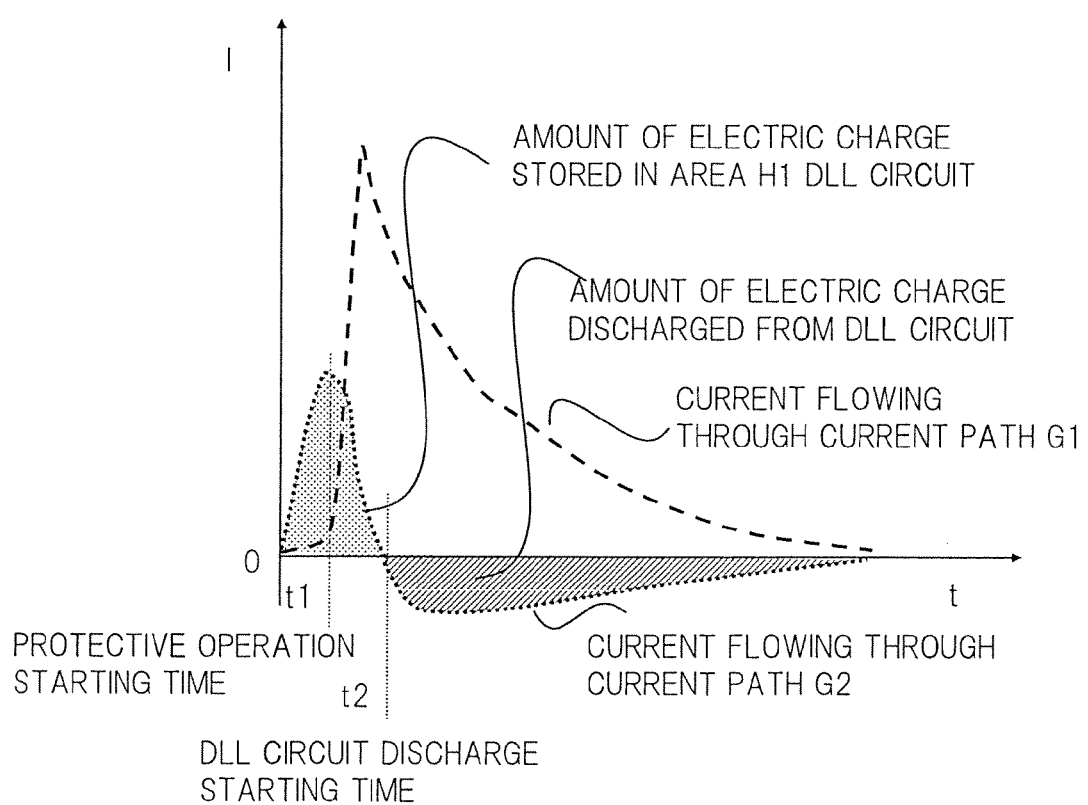
FIG. 6B is a diagram showing the relationship between an ESD-applied pulse and electric charges.
Figure 7:
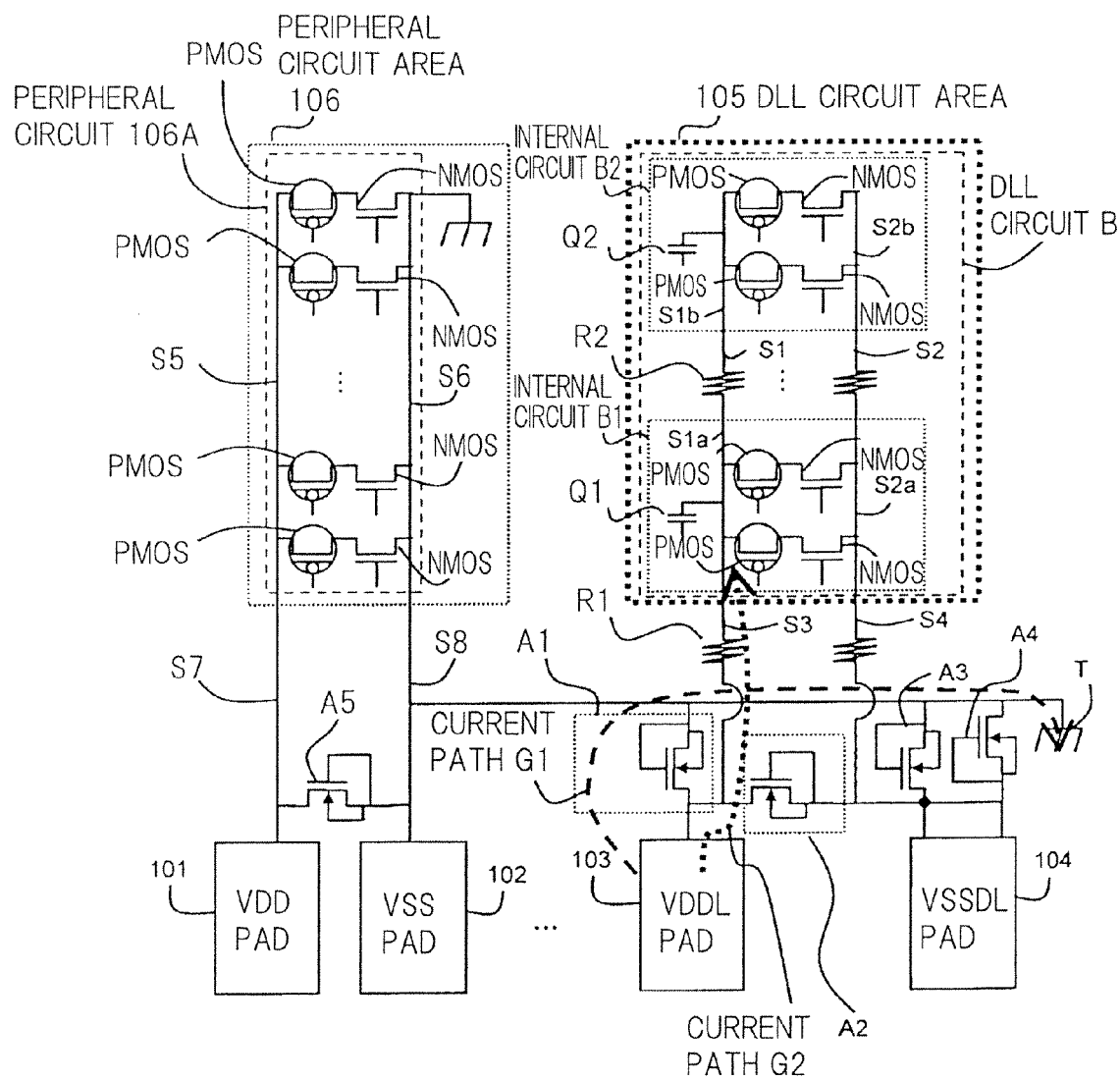
FIG. 7 is a diagram illustrative of a circuit operation.
Figure 8:
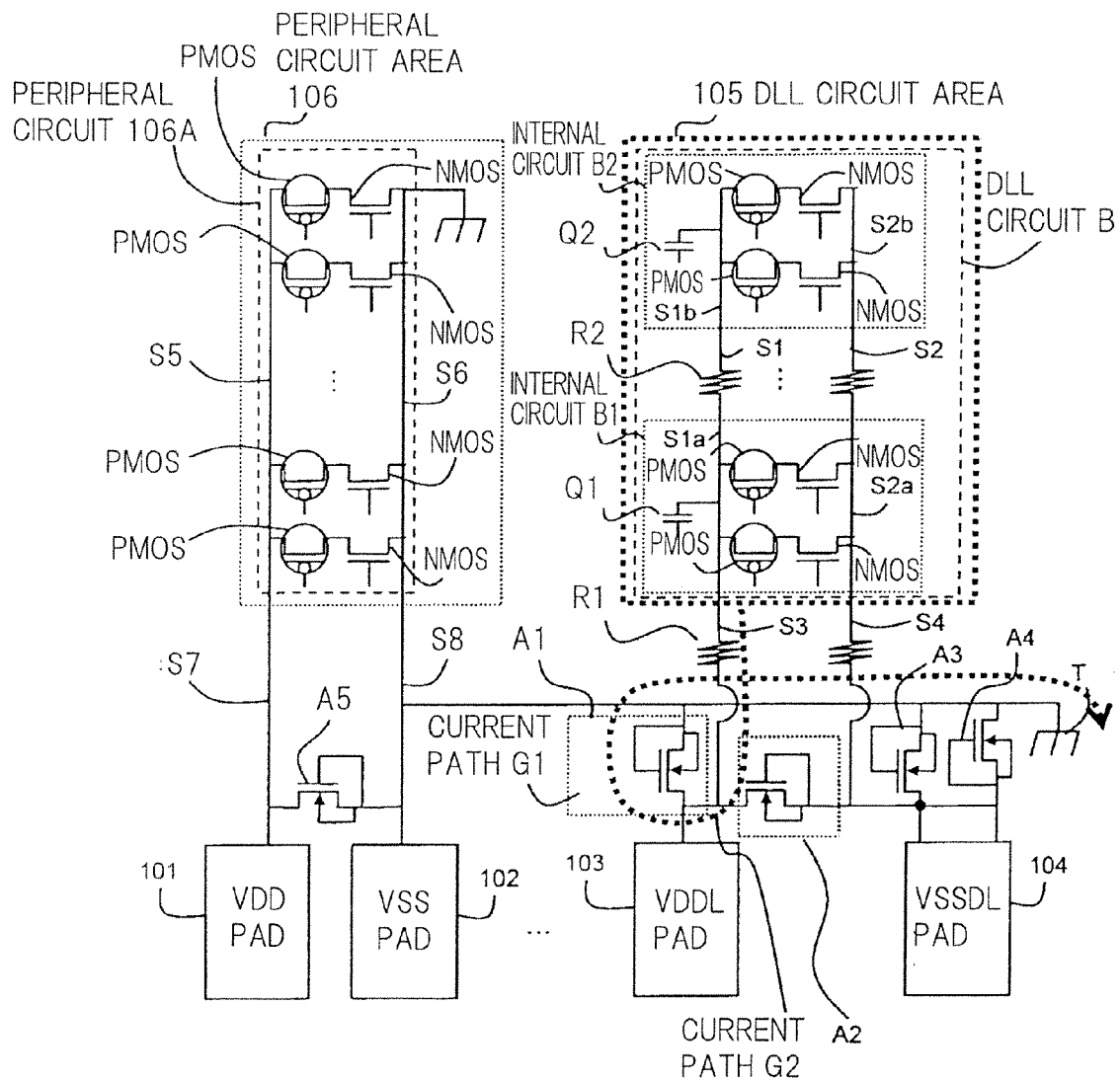
FIG. 8 is a diagram illustrative of a circuit operation.

First Exemplary Embodiment:

A semiconductor device according to a first exemplary embodiment of the present invention will be described in detail below with reference to FIG. 11. Those parts of the semiconductor device according to the first embodiment which are identical to those shown in FIG. 2A are denoted by identical reference characters. Identical parts will not be described in detail below. The semiconductor device according to the first embodiment is different from the e semiconductor device shown in FIG. 2A in that the semiconductor device according to the first embodiment additionally includes protective element A6.

Figure 11:
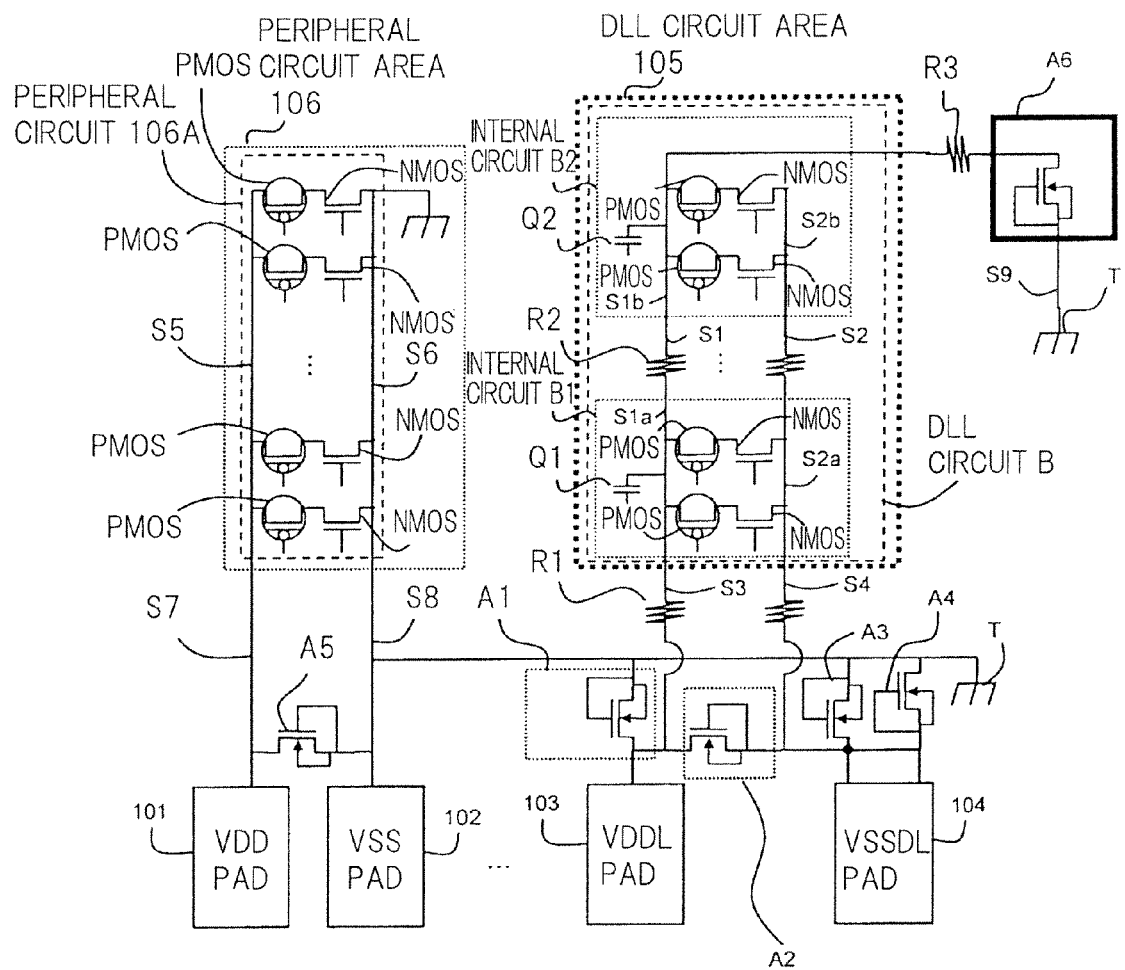
FIG. 11 is a circuit diagram of a semiconductor device according to a first exemplary embodiment of the present invention.
Figure 1:
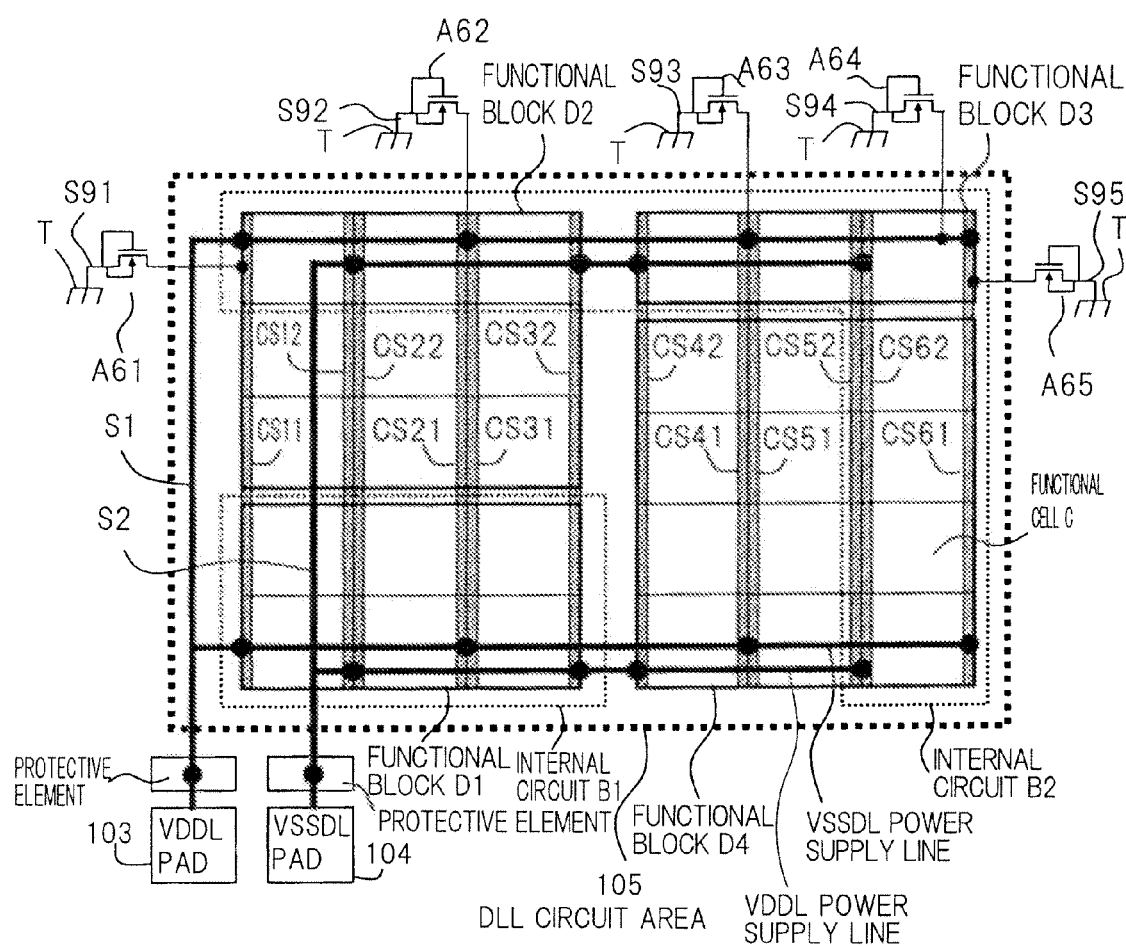

As shown in FIG. 11, protective element A6 is connected between interconnect S1 in DLL circuit area 105 and interconnect S9, and functions as a current path for passing an ESD-induced current from interconnect S1 to interconnect S9. Protective element A6 provides the current path from interconnect S1 to interconnect S8 when the potential on interconnect S1 reaches a trigger potential for protective element A6. Since interconnect S1 and interconnect S3 are connected to each other, protective element A6 provides a current path from interconnect S1 to interconnect S8 when the potential on interconnect S3 reaches the trigger potential for protective element A6. According to the present exemplary embodiment, protective element A6 provides a current path from interconnect S1b to interconnect S9 when the potential on interconnect S1b reaches the trigger potential for protective element A6. According to the present exemplary embodiment, the trigger potential for protective element A6 is equal to a trigger potential for protective element A1. Therefore, protective element A6 provides current paths between interconnect S1 and interconnects S8 and S9 when protective element A1 provides current paths from interconnect S3 to interconnects S8 and S9. The trigger potential for protective element A6 may not be equal to the trigger potential for protective element A1. Interconnect S9 is connected to ground electrode T in substrate P-sub other than DLL circuit area 105.

VDDL pad 103 is an example of a power supply pad, and VDD pad 101 is an example of another power supply pad.

DLL circuit B is an example of a prescribed circuit. The prescribed circuit is not limited to a DLL circuit, but may be changed to any of various circuits, e.g., PLL (Phase Locked Loop) circuit.

Interconnect S1 is an example of a power supply interconnect. Interconnect S3 is an example of a first interconnect. Each of interconnects S8 and S9 is an example of a second interconnect. Ground potential VSS is an example of a prescribed potential. Protective element A1 is an example of a first electrostatic protective element. The trigger voltage for protective element A1 is an example of a first threshold value. Protective element A6 is an example of a second electrostatic protective element. The trigger voltage for protective element A2 is an example of a second threshold value. Protective element A1 is disposed outside DLL circuit B and near VDDL pad 103 of interconnect S3. Protective element A6 has an end, which is connected to interconnect Si in DLL circuit B, and another end which is connected to interconnect S9. According to the present exemplary embodiment, protective elements A1 and A6 comprise diode-connected transistors of the same conductivity type. Protective element A5 is an example of a third electrostatic protective element. Protective element A5 is connected to VDD pad 101. Peripheral circuit area 106 is an example of a circuit area. Peripheral circuit area 106 includes peripheral circuit 106A therein. Peripheral circuit area 106 has interconnect S5 for supplying power supply VDD from VDD pad 101 to peripheral circuit 106A. Peripheral circuit 106A is an example of a circuit that is different from the prescribed circuit. Interconnect S5 is an example of another power supply interconnect.

Interconnects S1a and S1b are examples of internal interconnects. Interconnect S3 which interconnects interconnect S1a and VDDL pad 103 is an example of a connecting interconnect. An interconnect, which includes interconnect S1a and interconnect S3 which interconnects interconnect S1b and VDDL pad 103, is an example of a connecting interconnect. Deep N well layer DNW is an example of an isolating layer. DLL circuit area 105 is an example of a prescribed circuit area. Ground electrode T is an example of a hypothetical electrode for supplying a prescribed potential to interconnects S8 and S9. According to the present exemplary embodiment, ground electrode T is connected to VSS pad 102 for supplying ground potential VSS through interconnects S8 and S9.

The semiconductor device according to the present exemplary embodiment includes power supply pad 103, prescribed circuit B including power supply interconnect S1, first interconnect S3 interconnecting power supply pad 103 and power supply interconnect S1, second interconnects S8 and S9 being set to prescribed potential VSS, first electrostatic protective element A1 providing a current path from first interconnect S3 to second interconnect S8 when the potential on first interconnect S3 reaches a first threshold value, and second electrostatic protective element A6 disposed between power supply interconnect S1 and second interconnect S9, second electrostatic protective element A6 providing a current path from power supply interconnect S1 to second interconnect S9 when the potential on first interconnect S3 reaches a second threshold value.

In the semiconductor device according to the present exemplary embodiment, second electrostatic protective element A6 provides the current path between power supply interconnect S1 and second interconnect S9 when first electrostatic protective element A1 provides the current path from first interconnect S3 to second interconnect S8.

In the semiconductor device according to the present exemplary embodiment, prescribed circuit B includes a plurality of internal circuits B1 and B2 including respective internal interconnect S1a or S1b. Power supply interconnect S1 comprises internal interconnects S1a and S1b. Internal interconnects S1a and S1b are connected to power supply pad 103 through a connecting interconnect comprising first interconnect S3 or through a connecting interconnect comprising first interconnect S3 and another internal interconnect S1a. Second electrostatic protective element A6 is disposed between second interconnect S9 and prescribed internal interconnect S1*b* whose connecting interconnect is the longest among internal interconnects S1*a* and S1*b*.

The semiconductor device according to the present exemplary embodiment also includes different power supply pad 101, which is different from power supply pad 103, third electrostatic protective element A5 connected to different power supply pad 101, and circuit area 106 in which different circuit 106A which is different from prescribed circuit B is provided, circuit area 106 including different power supply interconnect S5 supplying electric power from different power supply pad 101 to different circuit 106A. The semiconductor device is devoid of an electrostatic protective element which is different from third electrostatic protective element A5 that is connected to different power supply interconnect S5 in circuit area 106.

The semiconductor device according to the present exemplary embodiment further includes substrate P-sub in which prescribed circuit B is disposed, isolating layer DNW which electrically separates substrate P-sub into prescribed circuit area 105 including prescribed circuit B therein and into a different area, and electrode T, which is disposed in the different area, supplying prescribed potential VSS to second interconnects S8 and S9.

In the semiconductor device according to the present exemplary embodiment, first electrostatic protective element A1 is disposed outside prescribed circuit B and near power supply pad 103 of interconnect S3, and second electrostatic protective element A6 has an end connected to power supply interconnect S1 in prescribed circuit B and another end connected to interconnect S9.

In the semiconductor device according to the present exemplary embodiment, first electrostatic protective element A1 and second electrostatic protective element A6 comprise diode-connected transistors of the same conductivity type.

The semiconductor device according to the present exemplary embodiment includes a new discharge path to ground electrode T near internal circuit B2.

The resistance value of parasitic resistor R3 between internal circuit B2 and protective element A6 should desirably be smaller than the resistance value of parasitic resistor R2 from VDDL pad 103 to internal circuit B2 (resistor R2>resistor R3).

Figure 9A:
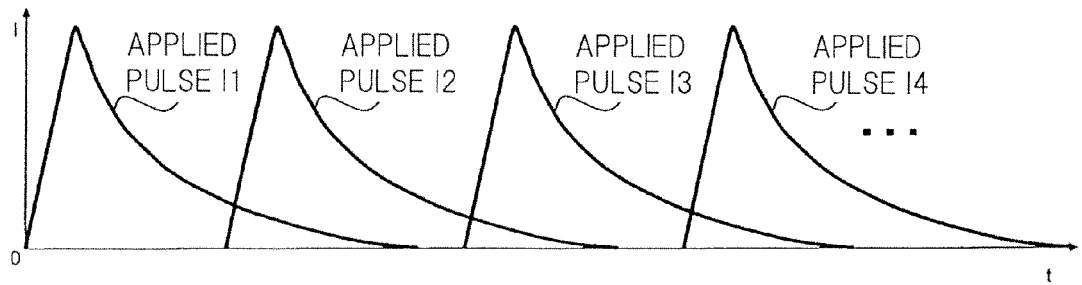
FIG. 9A is a diagram showing a succession of ESD-applied pulses.
Figure 9B:
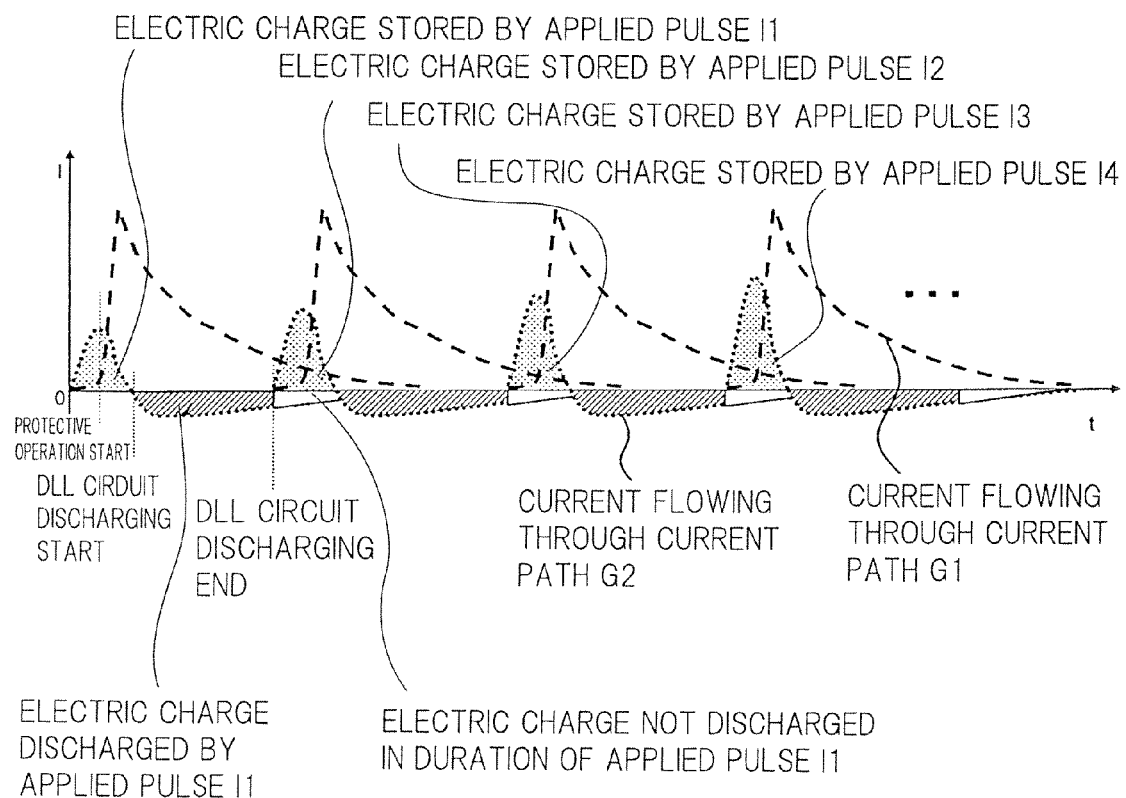
FIG. 9B is a diagram showing the relationship between a succession of ESD-applied pulses and electric charges.
Figure 10:
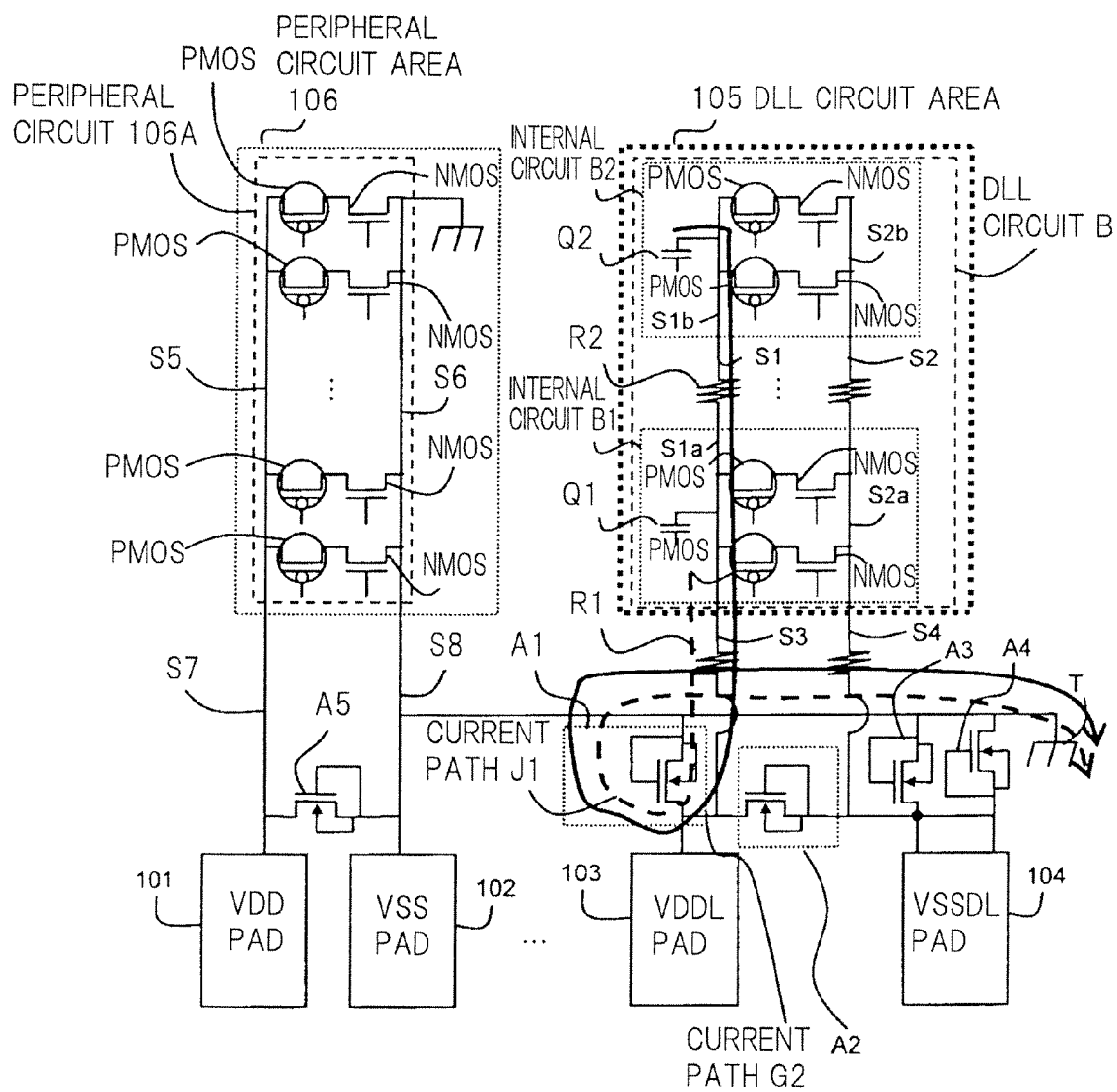
FIG. 10 is a diagram showing discharge paths of a DLL circuit.

When a succession of pulses as shown in FIG. 9A are applied to the semiconductor device shown in FIG. 11, electric charge Q2, which would not be fully discharged but progressively stored based on a method for connecting protective elements according to the related art, is discharged through the discharge path provided by protective element A6 into ground electrode T.

As the resistance values of the parasitic resistors have a relationship in which resistor R2>resistor R3, the efficiency at which electric charge Q2, stored in internal circuit B2, can be discharged is much better than with the semiconductor device shown in FIG. 2A. Even when a succession of pulses as shown in FIG. 9A are applied to the semiconductor device, an electric charge is not likely to remain in internal circuit B2, and the probability that it will be prevented from suffering an ESD breakdown is increased.

Though it is desirable that the resistance values of the parasitic resistors have a relationship in which resistor R2>resistor R3 as described above, even if they have a relationship in which resistor R3 resistor R2, such a relationship is effective to increase the ESD withstand voltage because more discharge paths are available for electric charge Q2.

FIG. 12 is a diagram showing the layout of DLL circuit B.

In the present exemplary embodiment, as shown in FIG. 12, protective elements A61 through A65 are added to DLL circuit B that is isolated from substrate P-sub by deep N well layer DNW, or more specifically to inner circuit B2 remotest from VDDL pad 103, among a plurality of internal circuits in DLL circuit B. Protective element A61 has an end connected to power supply line CS11. Protective element A65 has an end connected to power supply line CS61. Each of protective elements A62 through A64 has one end connected to interconnect S1. Each of Protective elements A61 through A65 has the other end connected respectively to interconnects S91 through S95 that are connected to ground terminal T. Protective elements A61 through A65 are examples of protective element A6 and the second electrostatic protective element. Power supply lines CS11 and CS61 are examples of the power supply line connected to interconnect S1 in DDL circuit B.

As shown in FIG. 12, a plurality of protective elements may be used as the second electrostatic protective element.

In the semiconductor device according to the present exemplary embodiment, the second electrostatic protective element comprises a plurality of electrostatic protective elements A61 through A65.

In the semiconductor device according to the present exemplary embodiment, each of second electrostatic protective elements A61 and A65 has one end connected to power supply line CS11 or CS61 that is connected to power supply interconnect S1 in prescribed circuit B.

The application of a succession of HBM pulses has been described above. However, when a succession of applied pulses are CDM pulses or MM pulses or a combination of theses pulses, the gate of internal circuit B2 is destroyed when protective elements are connected according to the related art based on the same principles. The present exemplary embodiment is, however, effective at preventing destruction when any of the above pulses are applied.

An example of protective element A6 will be described below.

Figure 13:
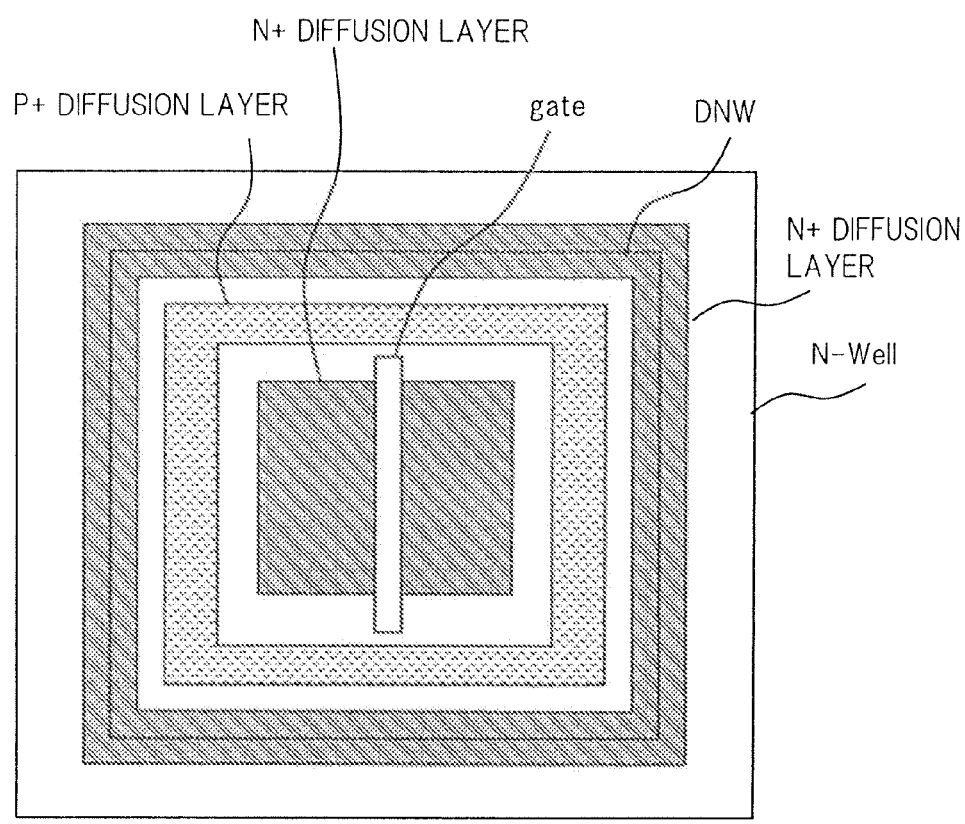
FIG. 13 is a plan view of a protective element in the DLL circuit shown in FIG. 12.
Figure 14:
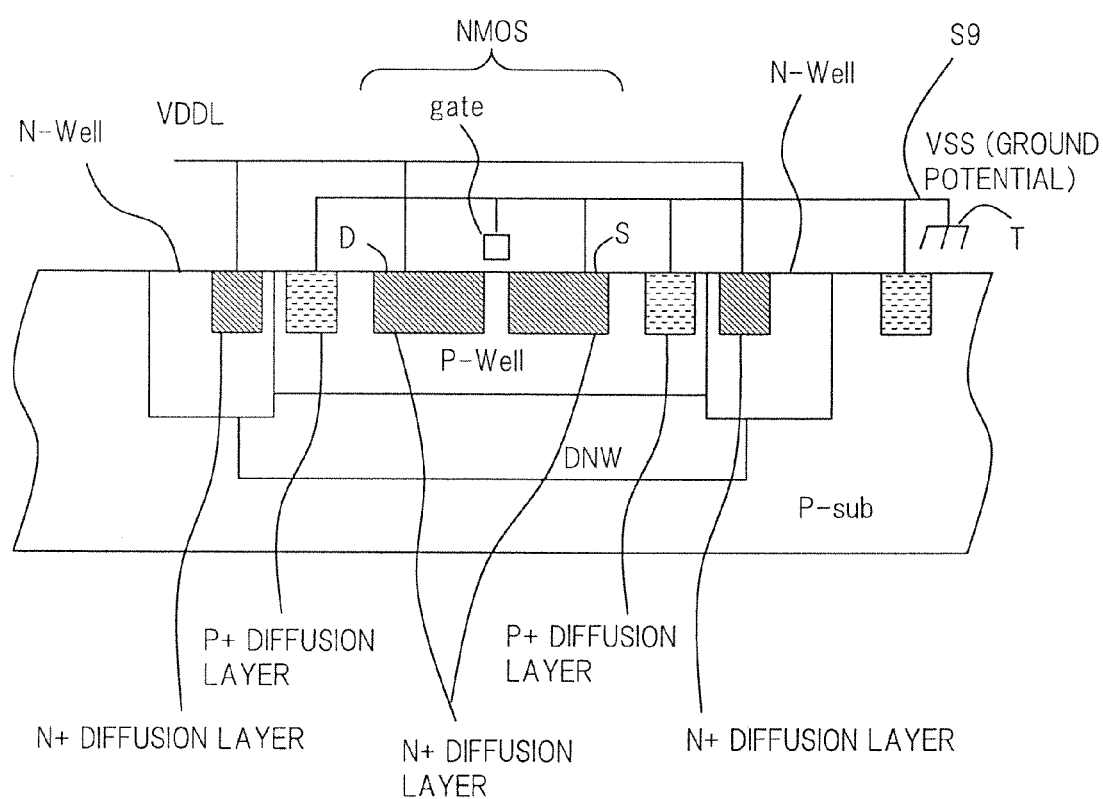
FIG. 14 is a cross-sectional view of a protective element

FIG. 13 is a plan view of protective element A6, and FIG. 14 is a cross-sectional view of protective element A6.

As shown in FIGS. 13 and 14, protective element A6 has deep N well layer DNW of VDDL potential disposed in substrate P-sub, and P well layer P-Well of ground potential VSS disposed in deep N well layer DNW. Transistor NMOS is disposed in P well layer P-Well.

Transistor NMOS has drain D, which is connected to VDDL pad 103, and source S and gate G that are connected to ground electrode T through interconnect S9.

When a voltage is applied to VDDL pad 103, an electric charge is discharged from drain D connected to VDDL pad 103 through source S to ground electrode T. Therefore, DDL circuit B is prevented from having an ESD breakdown.

According to the present exemplary embodiment, protective element A1 provides a current path from interconnect S3 to interconnect S8 when the potential on interconnect S3, which interconnects VDDL pad 103 and interconnect S1 in DLL circuit B, reaches the trigger potential for protective element A1. Therefore, when the potential on interconnect S3 reaches the trigger potential for protective element A1 due to an ESD, an ESD-induced current flows through the current path from interconnect S3 to interconnect S8.

When an ESD occurs, until the potential on interconnect S3 reaches the trigger potential for protective element A1, the ESD-induced electric charge is stored in DDL circuit B including interconnect S1.

Protective element A6 provides a current path from interconnect S1 in DLL circuit B to interconnect S9 when the potential on interconnect S3 reaches the trigger potential for protective element A6. Therefore, when the potential on interconnect S3 reaches the trigger potential for protective element A6 due to an ESD-induced electric charge, the electric charge, which has been stored in DLL circuit B due to an ESD, flows into interconnect S9.

Consequently, an increased number of paths are available for discharging the electric charge that has been stored in DLL circuit B due to an ESD surge, making it possible to increase the withstand voltage of the semiconductor device against ESDs.

According to the present exemplary embodiment, furthermore, protective element A6 provides a current path between interconnect S1 and interconnect S9 when protective element A1 provides a current path from interconnect S3 to interconnect S8.

Therefore, an ESD-induced electric charge can flow into interconnects S8 and S9 simultaneously through the current path provided by protective element A1 and through the current path provided by protective element A6. Consequently, the ESK-induced electric charge can be removed from DLL circuit B within a short period of time.

According to the present exemplary embodiment, moreover, protective element A6 is constructed of a plurality of protective elements A61 through A65. In this case, it is possible to provide a plurality of current paths between interconnect S1 in DLL circuit B and interconnects S9 and S8. Therefore, it is possible to remove an ESD-induced electric charge from DLL circuit B within a short period of time.

According to the present exemplary embodiment, protective element A6 provides a path along which an ESD-induced current flows from interconnect S1b to interconnect S9. Interconnect S1b is an interconnect whose connecting interconnect is the longest among the internal interconnects of interconnect S1 in DLL circuit B. As a connecting interconnect is longer, its resistance value is greater. Therefore, protective element A6 provides a path for removing an electric charge from internal circuit B2, from which an electric charge is least likely to be removed through protective element A1, from among a plurality of internal circuits B1 and B2. Therefore, the withstand voltage of the semiconductor device against ESDs is increased.

According to the present exemplary embodiment, there are no electrostatic protective elements, other than protective element A5, connected to interconnect S5 in peripheral circuit area 106. Therefore, the semiconductor device is simpler in structure than if those electrostatic protective elements were present.

According to the present exemplary embodiment, DDL circuit B is disposed in DLL circuit area 105 that is electrically isolated from substrate P-sub by deep N well layer DNW. Ground electrode T is disposed in an area of substrate P-sub which is different from DLL circuit area 105. Therefore, circuits, which are disposed in the area that is electrically isolated from the substrate, are made resistant to ESDs.

According to the present exemplary embodiment, it is desirable that protective element A1 be disposed outside DLL circuit B and near power supply pad 103 of interconnect S3, and that protective element A6 (A62 through S64) have an end connected to interconnect S1 in DLL circuit B and another end connected to interconnect S9.

According to the present exemplary embodiment, furthermore, protective element A6 (A61 through S65) may have an end connected to power supply line CS11 or CS61 that is connected to interconnect S1 in DLL circuit B.

According to the present exemplary embodiment, protective element A1 and protective element A2 comprise diode-connected transistors of the same conductivity type. In this case, protective element A1 and protective element A2 thus constructed have their characteristics, e.g., trigger voltages, brought into conformity with each other.

Second Exemplary Embodiment:

A semiconductor device according to a second exemplary embodiment of the present invention will be described in detail below. The semiconductor device according to the second exemplary embodiment is different from the semiconductor device according to the first exemplary embodiment in that a diode is used as protective element A6 shown in FIG. 11 or 12. Stated otherwise, according to the present exemplary embodiment, protective element A6 comprises a diode.

The features of the semiconductor device according to the second exemplary embodiment, which are different from those of the semiconductor device according to the first exemplary embodiment, will be described below.

Figure 15:
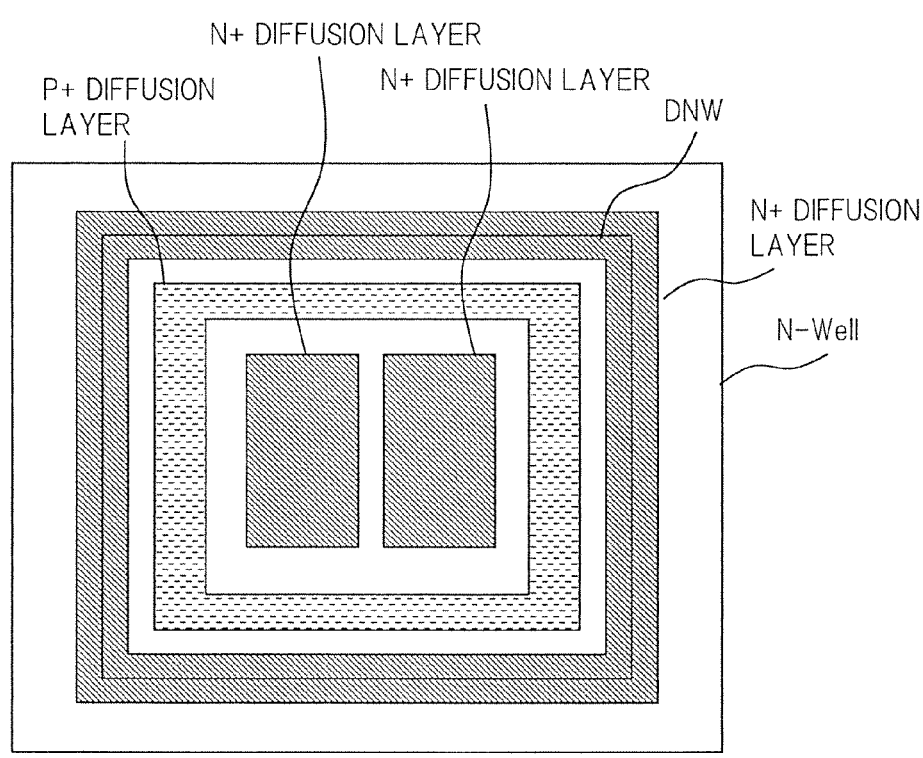
FIG. 15 is a plan view of a diode of the protective element shown in FIG. 13.
Figure 16:
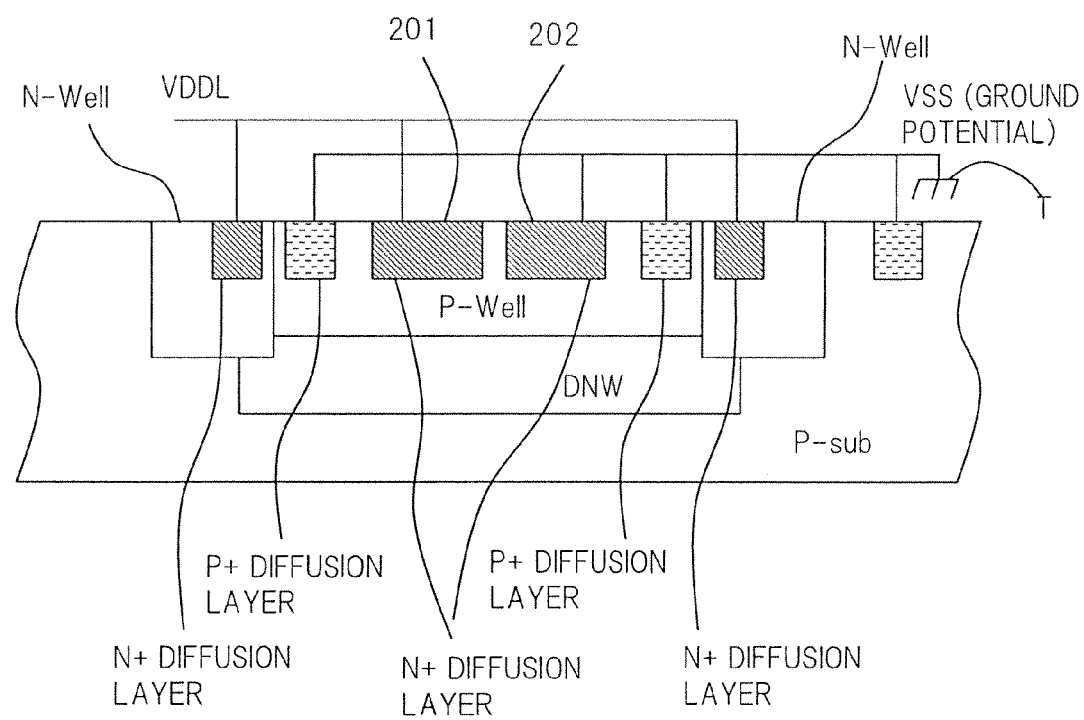
FIG. 16 is a cross-sectional view of the diode shown in FIG. 15.

FIG. 15 is a plan view of a diode used as protective element A6. FIG. 16 is a cross-sectional view of the diode shown in FIG. 15.

As shown in FIGS. 15 and 16, deep N well layer DNW of VDDL potential is disposed in substrate P-sub, and P well layer P-Well of ground potential VSS is disposed in deep N well layer DNW. A diode is constructed of two N+ diffusion layers 201 and 202 in P well layer P-Well.

N+ diffusion layer 201 is connected to VDDL pad 103, and N+ diffusion layer 202 is connected to ground electrode T (ground potential VSS).

When a voltage is applied to VDDL pad 103, an electric charge flows from N+ diffusion layer 201 connected to VDDL pad 103 into P well layer P-Well, and is discharged through N+ diffusion layer 202 into ground electrode T. Therefore, DLL circuit B is prevented from suffering an ESD breakdown.

Figure 17:
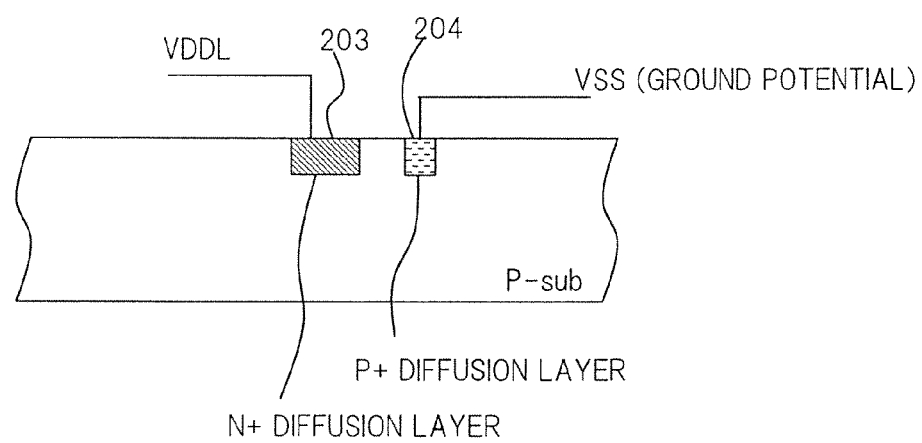
FIG. 17 is a cross-sectional view of another protective element.

In the first exemplary embodiment, protective element A6 of MOS structure has been described in FIGS. 13 and 14. In the second exemplary embodiment, protective element A6 of diode structure has been described in FIGS. 15 and 16. However, protective element A6 may be of a structure other than those shown in FIGS. 13 through 16 insofar as it can discharge electric charges and it is not susceptible to power supply noise. For example, as shown in FIG. 17, protective element A6 may have N+ diffusion layer 203 connected to VDDL pad 103 and P+ diffusion layer 204 connected to ground electrode T.

Depending on the potential of protective element A6, a protective element of PMOS structure including a P+ diffusion layer may be used, or a diode comprising a P+ diffusion lay may be used as a protective element, instead of a protective element of NMOS structure including an N+ diffusion layer.

Third Exemplary Embodiment:

A semiconductor device according to a third exemplary embodiment of the present invention will be described in detail below. The semiconductor device according to the third exemplary embodiment is different from the semiconductor device according to the first exemplary embodiment in that source S of protective element A6 shown in FIG. 11 or 12 is not connected to ground electrode T.

Figure 18:
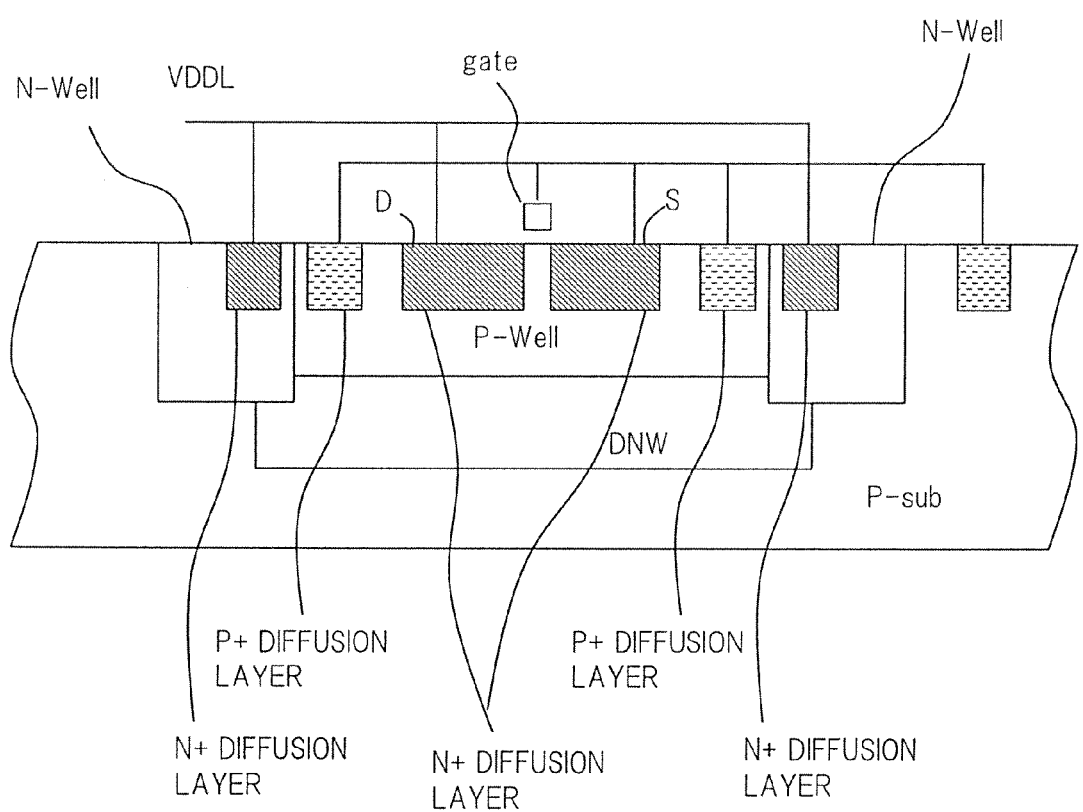
FIG. 18 is a cross-sectional view of a protective element in a semiconductor device according to a third exemplary embodiment of the present invention.

FIG. 18 is a cross-sectional view of protective element A6 in the semiconductor device according to the third exemplary embodiment of the present invention. In this case, substrate P-sub connected to source S of protective element A6 should desirably be of ground potential VSS. Ground potential VSS is an example of a prescribed potential. In the present exemplary embodiment, an area of substrate P-sub which is set to prescribed potential VSS, i.e., an area different from DLL circuit area 105, also functions as an electrode for supplying prescribed potential VSS to second interconnect S9.

The semiconductor device according to the third exemplary embodiment is effective where there is not an interconnect (VSS power supply line) directly connected to ground electrode T near protective element A6.

Fourth Exemplary Embodiment:

A semiconductor device according to a fourth exemplary embodiment of the present invention will be described in detail below. The semiconductor device according to the fourth exemplary embodiment is different from the semiconductor device according to the first exemplary embodiment in that source S of protective element A6 shown in FIG. 11 or 12 is not connected to substrate P-sub.

Figure 19:
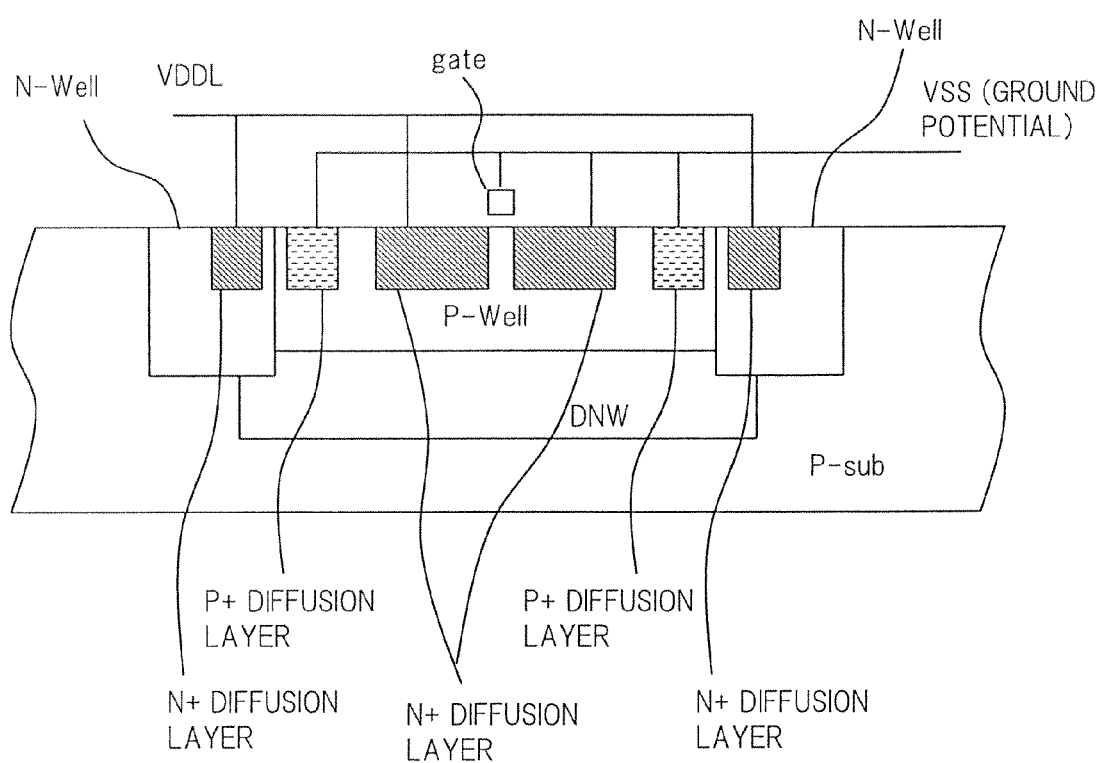
FIG. 19 is a cross-sectional view of a protective element in a semiconductor device according to a fourth exemplary embodiment of the present invention.

FIG. 19 is a cross-sectional view of protective element A6 in the semiconductor device according to the fourth exemplary embodiment of the present invention. According to the present exemplary embodiment, an electrode for supplying prescribed potential VSS to second interconnect S9 serves as a ground electrode.

The semiconductor device according to the fourth exemplary embodiment is effective where it is difficult to connect ground electrode T to substrate P-sub near protective element A6.

Figure 20:
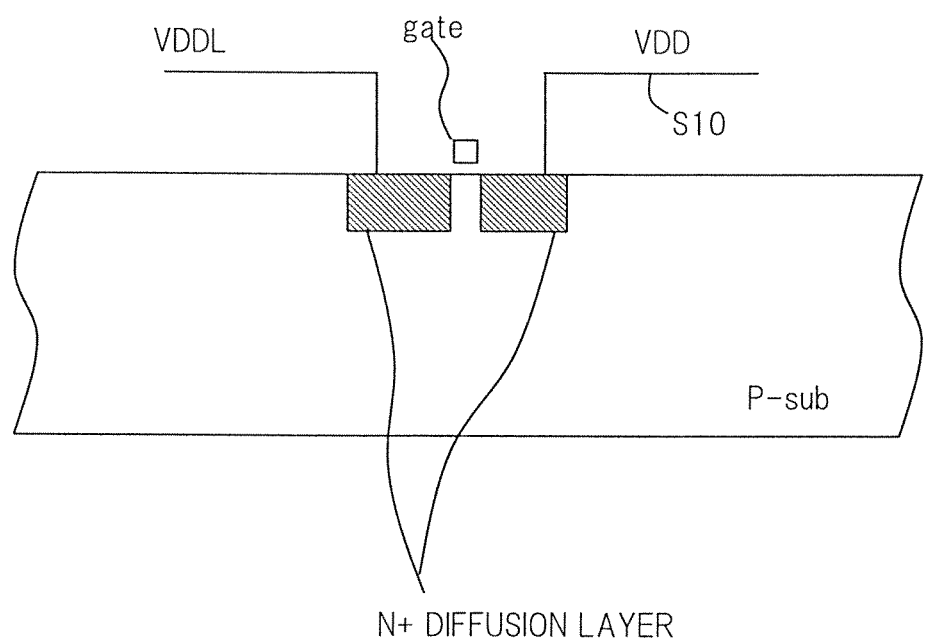
FIG. 20 is a cross-sectional view of still another protective element.

Fifth Exemplary Embodiment:

A semiconductor device according to a fifth exemplary embodiment of the present invention will be described in detail below. The semiconductor device according to the fifth exemplary embodiment is different from the semiconductor device according to the first exemplary embodiment in that source S of protective element A6 shown in FIG. 11 or 12 is connected to interconnect (interconnect layer) S10 that is connected to VDD pad 101, as shown in FIG. 20. According to the present exemplary embodiment, an electrode for supplying prescribed potential VSS to second interconnect S9 serves as power supply electrode 101 for receiving a power supply voltage under a high potential.

An opposite potential that is applied to source S of protective element A6 should preferably be a potential applied to the substrate, but may be another potential (VDD), as shown in FIG. 20, if it is of a capacity large enough to discharge electric charges.

Figure 21:
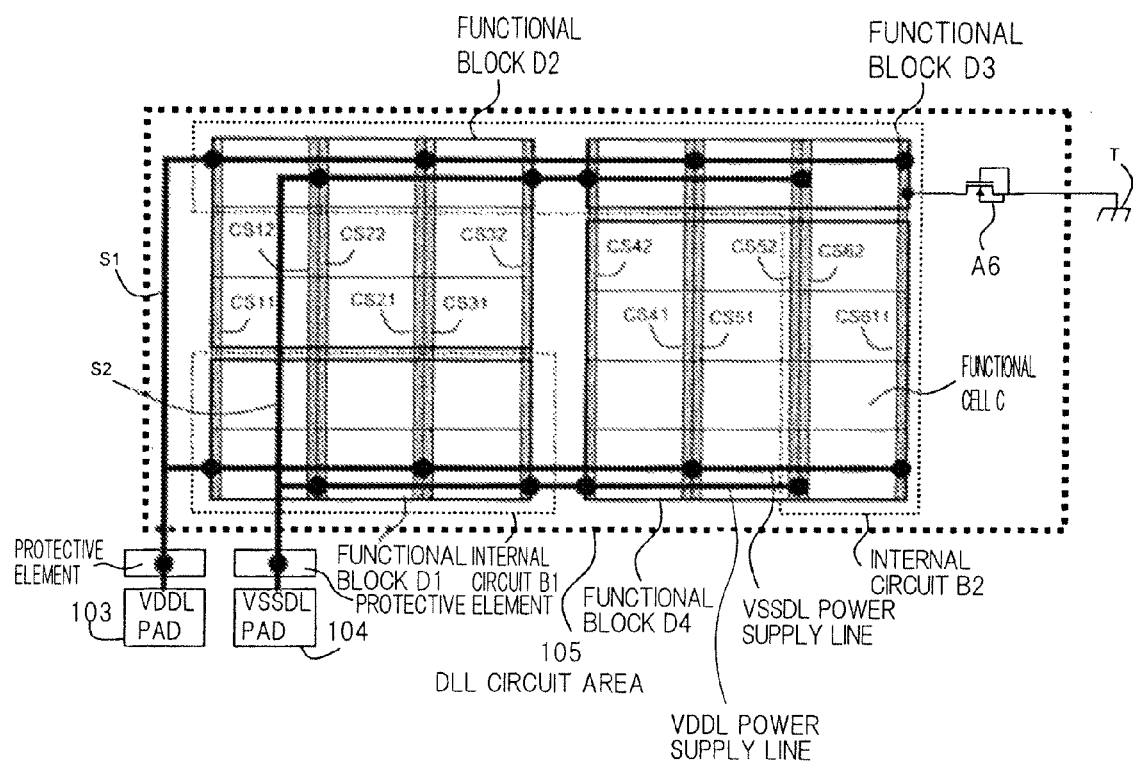
FIG. 21 is a diagram showing details of a DLL circuit area.

Sixth Exemplary Embodiment:

A semiconductor device according to a sixth exemplary embodiment of the present invention will be described in detail below. The semiconductor device according to the sixth exemplary embodiment is different from the semiconductor device according to the first exemplary embodiment in that protective element A6 shown in FIG. 11 or 12 is disposed in DLL circuit area 105 including DLL circuit B therein. FIG. 21 is a diagram showing a semiconductor device with protective element A6 disposed in DLL circuit area 105. According to the present exemplary embodiment, second electrostatic protective element A6 is disposed in prescribed circuit area 105.

Seventh Exemplary Embodiment:

A semiconductor device according to a seventh exemplary embodiment of the present invention will be described in detail below. The semiconductor device according to the seventh exemplary embodiment is different from the semiconductor device according to the first exemplary embodiment in that protective element A6 shown in FIG. 11 or 12 is disposed in an area (first area), which is different from DLL circuit area 105, of the area isolated from substrate P-sub by deep N well layer DNW.

Figure 22:
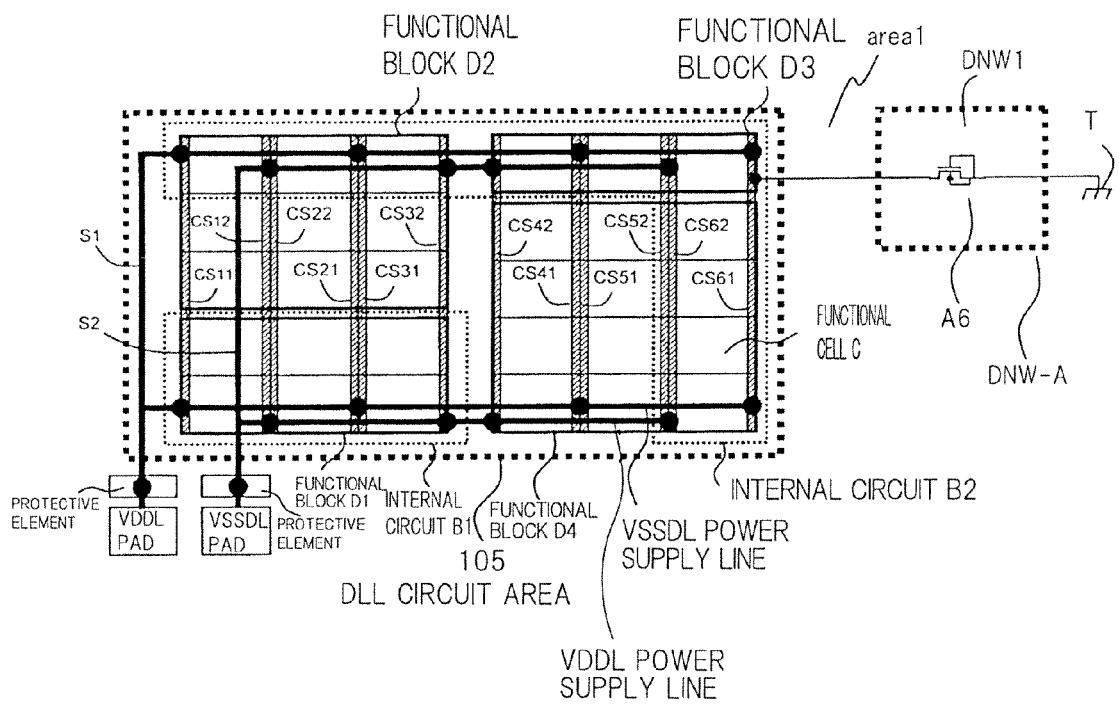
FIG. 22 is a diagram showing the relationship between a DLL circuit area and a protective element.

FIG. 22 is a diagram showing the relationship between DLL circuit area 105 and protective element A6 in the semiconductor device according to the seventh exemplary embodiment.

As shown in FIG. 22, the potential of area DNW1, which is defined by deep N well layer DNW-A and includes protective element A6 that is disposed therein, may be identical to, or different from, the potential of DLL circuit area 105 which is defined by deep N well layer DNW and which includes DLL circuit B disposed therein. In FIG. 22, area areal of substrate P-sub, which is neither area DNW1 nor DLL circuit area 105, is an example of a second area. Deep N well layer DNW-A which defines area DNW1 is an example of an area isolating layer. According to the present exemplary embodiment, second electrostatic protective element A6 is disposed in an area (another area) that is different from DLL circuit area 105, and area isolating layer DNW-A, which separates the other area into first area DNW1 including second electrostatic protective element A6 and into second area areal other than first area DNW1, is included.

Area DNW1, which is isolated from substrate P-sub by deep N well layer DNW and which includes protective element A6 disposed therein, may include a circuit that is different from DLL circuit B.

The location of protective element A6 shown in FIG. 22 is not necessarily limited to the area isolated from substrate P-sub in deep N well layer DNW-A insofar as no power supply noise is applied through protective element A6.

As shown in FIGS. 21 and 22, the location of protective element A6 may be selected as desired in each of the exemplary embodiments.

Eighth Exemplary Embodiment:

A semiconductor device according to an eighth exemplary embodiment of the present invention will be described in detail below. The semiconductor device according to the eighth exemplary embodiment is different from the semiconductor device according to the first exemplary embodiment in that a memory cell array (hereinafter simply referred to as "array") is used as a prescribed circuit. In other words, according to the present exemplary embodiment, the prescribed circuit comprises array AR.

Figure 23:
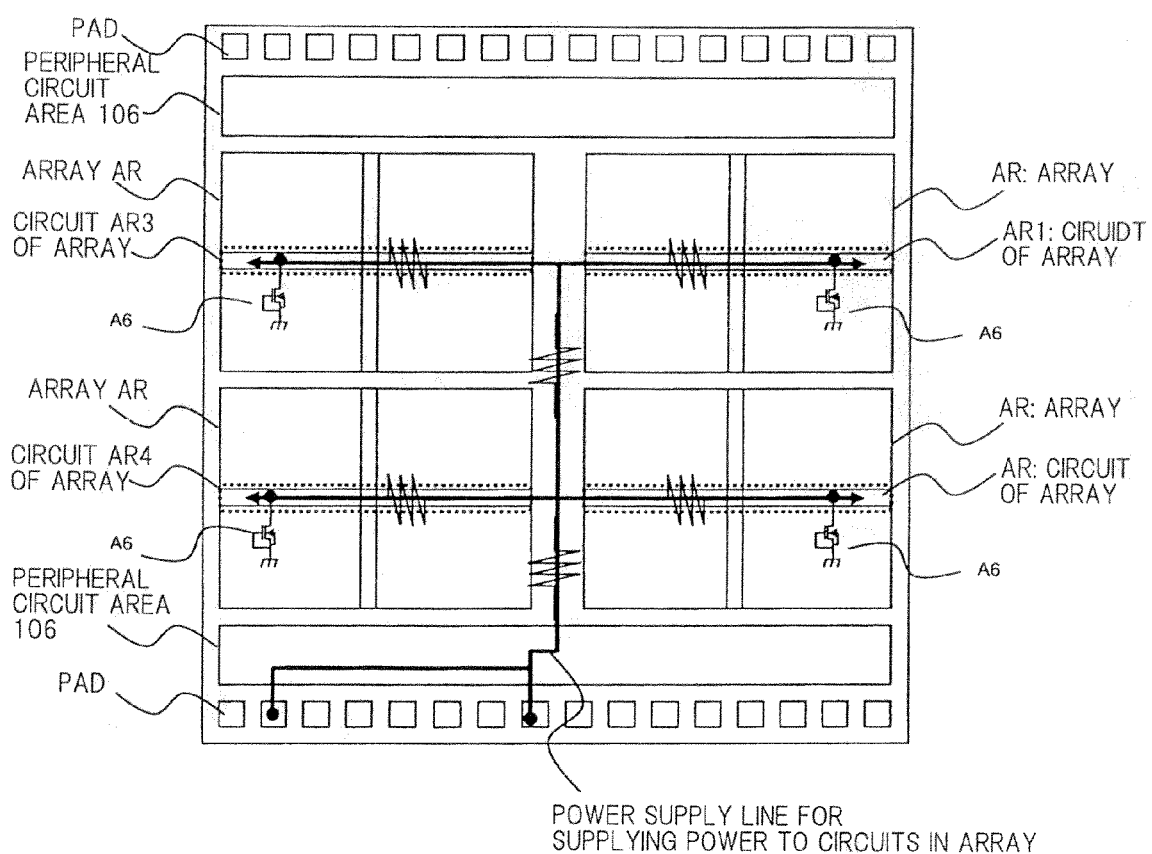
FIG. 23 is a plan view of a semiconductor device according to an eighth exemplary embodiment of the present invention.

FIG. 23 is a plan view of a semiconductor device according to the eighth exemplary embodiment of the present invention.

As shown in FIG. 23, array AR includes circuits AR1 through AR4 that are electrically isolated from substrate P-sub by deep N well layer DNW. In addition, the resistance of the parasitic resistor from a power supply pad to array AR is large because array AR is located centrally in the chip. When a voltage is applied to the power supply pad, an electric charge is not discharged, but stored in the area defined by deep N well layer DNW.

As with DLL circuit B described above, when a succession of pulses due to an ESD are applied, the electric charge that is stored in circuits AR1 through AR4 of array AR is progressively increased until finally the gates of circuits AR1 through AR4 of array AR will be destroyed.

However, the connection of protective element A6 to circuits AR1 through AR4 of array AR is effective at preventing the breakdown of the gates of circuits AR1 through AR4 of array AR that is isolated from substrate P-sub by deep N well layer DNW.

In the present exemplary embodiment, protective element A1 is connected to the pad, though it is omitted from illustration in FIG. 23.

Ninth Exemplary Embodiment:

A semiconductor device according to a ninth exemplary embodiment of the present invention will be described in detail below. The semiconductor device according to the ninth exemplary embodiment is different from the semiconductor device according to the first exemplary embodiment in that the semiconductor device is an ASIC (Application Specific Integrated Circuit) including a logic circuit and in that the logic circuit of the ASIC is used as a prescribed circuit. According to the present exemplary embodiment, the prescribed circuit comprises logic circuit M of the ASIC.

Figure 24:
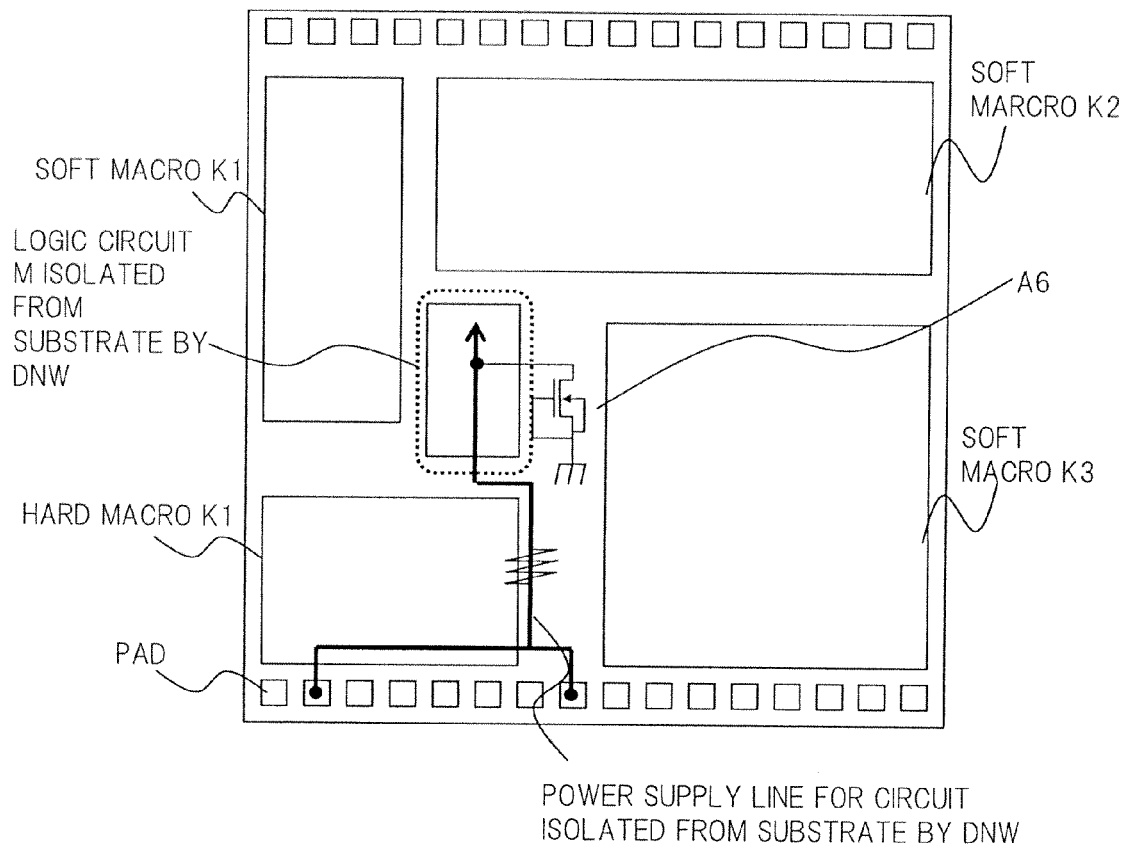
FIG. 24 is a plan view of a semiconductor device according to a ninth exemplary embodiment of the present invention, showing a floor plan of an ASIC.

FIG. 24 is a plan view of a semiconductor device according to the ninth exemplary embodiment of the present invention, showing a floor plan of an ASIC.

As shown in FIG. 24, logic circuit M, which is electrically isolated from substrate P-sub by deep N well layer DNW, is disposed nearly centrally in the semiconductor device. If no protective circuit A6 were connected to logic circuit M, then since the resistance of the parasitic resistor from the power supply pad to logic circuit M is large, when a voltage is applied to the power supply pad, an electric charge is not discharged from logic circuit M, but stored therein.

As with DLL circuit B in the area that is electrically isolated from substrate P-sub by deep N well layer DNW, when a succession of pulses due to an ESD are applied, the electric charge in logic circuit M is progressively increased until finally the gates in logic circuit M will be destroyed.

According to the present exemplary embodiment, if protective element A6 is connected to a power supply interconnect of logic circuit M, it is possible to prevent the gates in logic circuit M from being destroyed.

In the present exemplary embodiment, protective element A1 is connected to the pad, though it is omitted from illustration in FIG. 24.

Tenth Exemplary Embodiment:

A semiconductor device according to a tenth exemplary embodiment of the present invention will be described in detail below. The semiconductor device according to the tenth exemplary embodiment is different from the semiconductor device according to the first exemplary embodiment in that voltage step-down circuit U, which supplies power supply voltage VPERI that has been stepped down from external power supply voltage VDDL, is connected to DLL circuit B.

Figure 25:
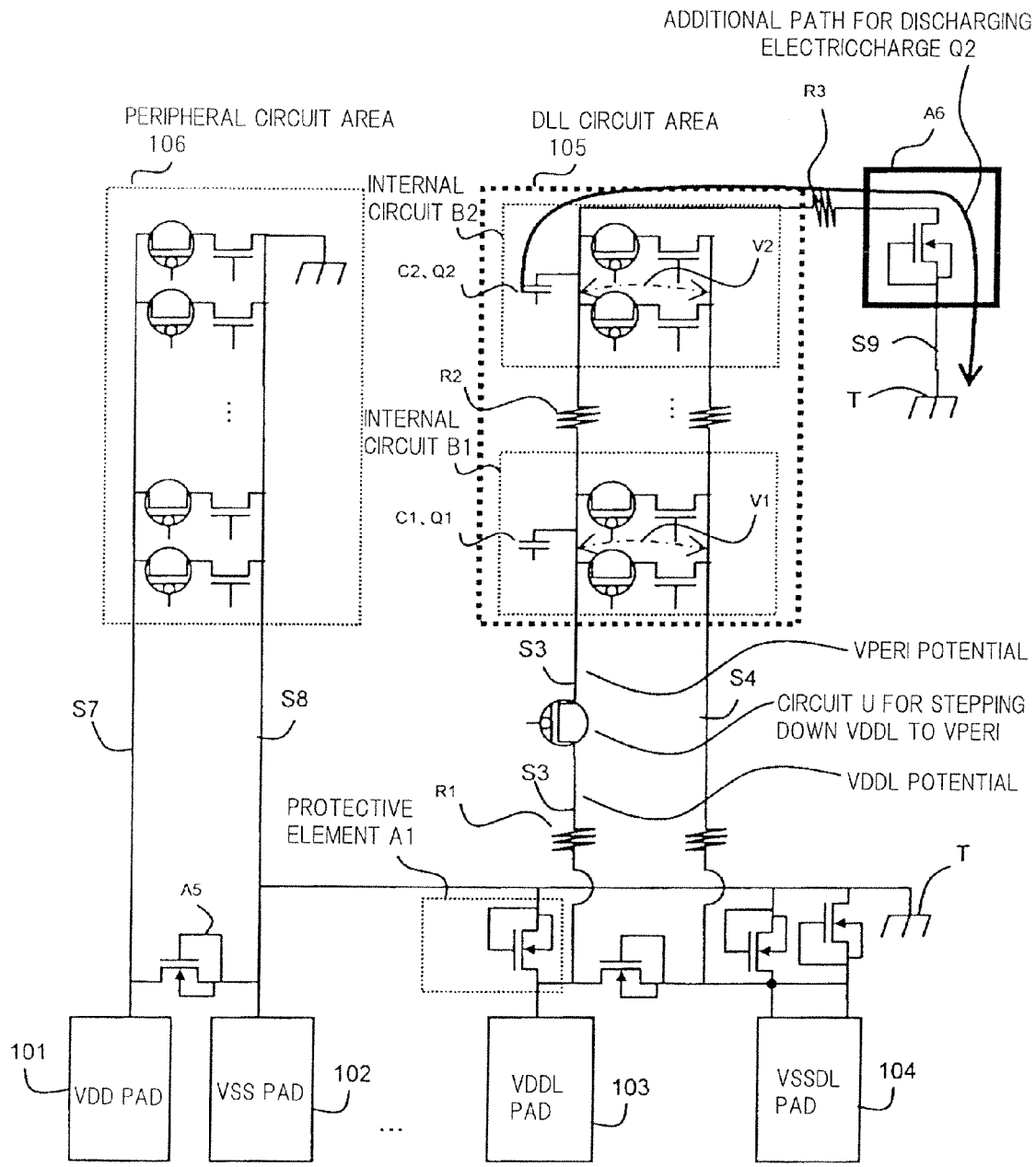
FIG. 25 is a circuit diagram of a semiconductor device according to a tenth exemplary embodiment of the present invention.

FIG. 25 is a circuit diagram of a semiconductor device according to the tenth exemplary embodiment of the present invention.

Figure 26:
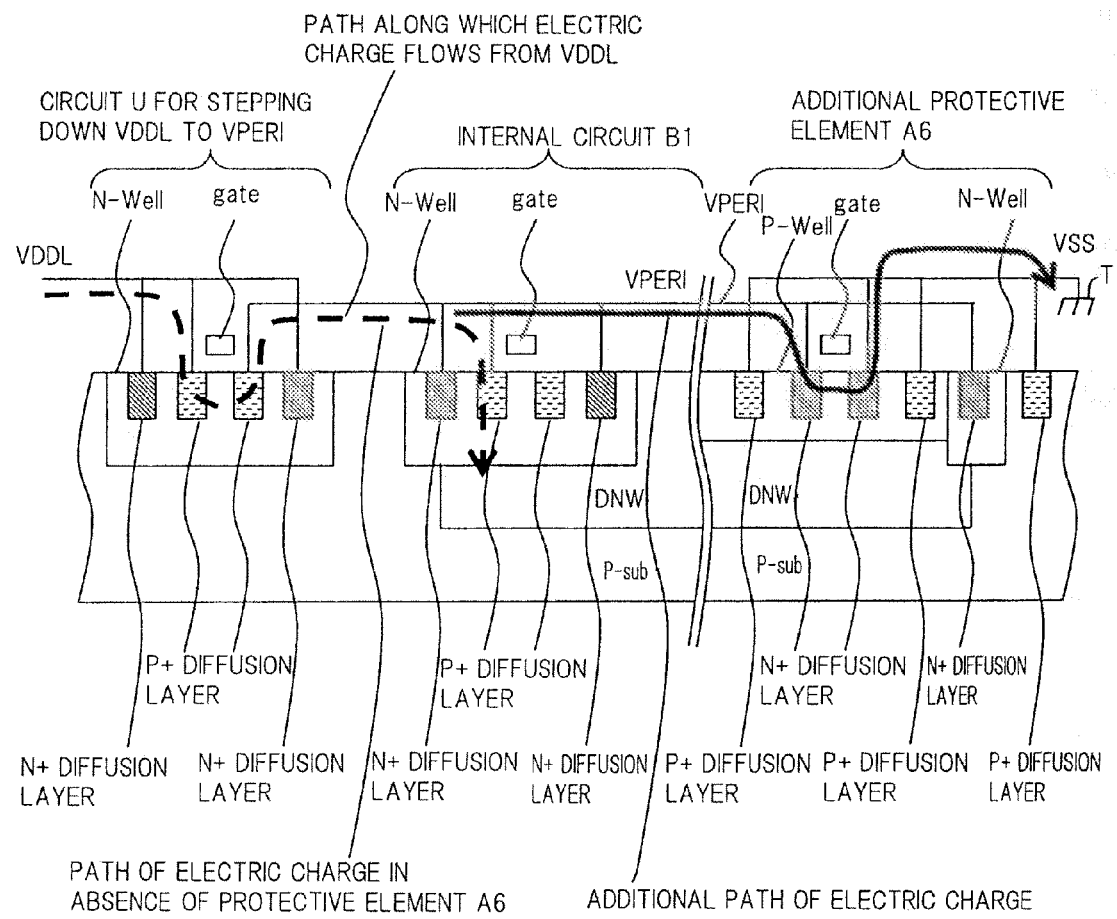
FIG. 26 is a cross-sectional view of a voltage step-down circuit, an internal circuit, and a protective element.

FIG. 26 is a cross-sectional view of voltage step-down circuit U, internal circuit B1, and protective element A6. The arrow in FIG. 26 represents a path along which an electric charge flows when a voltage is applied to VDDL pad 103. According to the present exemplary embodiment, voltage step-down circuit U, which steps down a power supply voltage applied to power supply pad 103 and which outputs the lowered power supply voltage, is connected to first interconnect S3.

As shown in FIGS. 25 and 26, even though a circuit, which is supplied with a stepped-down voltage of power supply voltage VPERI, is electrically isolated from substrate P-sub by deep N well layer DNW, an electric charge is stored in the internal circuit in the absence of protective element A6. Therefore, the gates in the internal circuit are likely to be destroyed.

If the capability of a circuit for stepping up and down a power supply voltage is large, then since its discharging capability for a breakdown is large, the gates in an internal circuit are likely to be destroyed.

Therefore, even when a circuit is generating an internal potential with respect to a certain potential, protective element A6, which is connected to an internal circuit disposed remotely from the pad, is effective at increasing the withstand voltage against ESDs.

In each of the above exemplary embodiments, protective element A6 is not limited to a diode-connected transistor or a diode, but may be a resistive element.

The illustrated details of the respective exemplary embodiments described above are by way of example only, and the present invention is not limited to those illustrated details.

For example, the power supply is isolated by deep N well layer DNW in the above exemplary embodiments. Since the same problem arises with an arrangement in which power supply interconnects are branched from one power supply pad to a plurality of circuits, each of the above exemplary embodiments is also applicable to such an arrangement. Furthermore, even if a single power supply interconnect is used to supply a power supply voltage, the same problem arises when an electrostatic pulse is applied before an electric charge stored by the preceding electrostatic pulse is fully discharged by the protective element near the power supply pad, provided that the single power supply interconnect is long. Accordingly, each of the above exemplary embodiments is also applicable to an arrangement using such a long single power supply interconnect.

It is apparent that the present invention is not limited to the above embodiments, but may be modified and changed without departing from the scope and spirit of the invention.

What is claimed is:

1. A semiconductor device comprising:
   a power supply pad;
   a prescribed circuit including a power supply interconnect;
   a first interconnect interconnecting said power supply pad and said power supply interconnect;
   a second interconnect being set to a prescribed potential;
   a first electrostatic protective element providing a current path from said first interconnect to said second interconnect when potential on said first interconnect reaches a first threshold value; and
   a second electrostatic protective element disposed between said power supply interconnect and said second interconnect, said second electrostatic protective element providing a current path from said power supply interconnect to said second interconnect when the potential on said first interconnect reaches a second threshold value.

2. The semiconductor device according to claim 1, wherein said second electrostatic protective element provides a current path between said power supply interconnect and said second interconnect when said first electrostatic protective element provides the current path from said first interconnect to said second interconnect.

3. The semiconductor device according to claim 1, further comprising:
   a different power supply pad that is different from said power supply pad;
   a third electrostatic protective element connected to said different power supply pad; and
   a circuit area in which a different circuit which is different from said prescribed circuit is provided, said circuit area including a different power supply interconnect supplying electric power from said different power supply pad to the different circuit;
   wherein the semiconductor device is devoid of an electrostatic protective element other than said third electrostatic protective element that is connected to the different power supply interconnect in said circuit area.

4. The semiconductor device according to claim 1, further comprising:
   a substrate in which said prescribed circuit is disposed;
   an isolating layer which electrically separates said substrate into a prescribed circuit area including said prescribed circuit therein and into a different area which is different from said prescribed circuit area; and an electrode, which is disposed in the different area, supplying said prescribed potential to said second interconnects.

5. A semiconductor device comprising:
first and second power supply pads supplied with first and second power voltages, respectively;
a first protection circuit coupled between the first and second power supply pads;
an internal circuit including a first power line and a plurality of transistors electrically coupled to the first power line, the first power line including first and second portions, the first portion being electrically connected to the first power supply pad; and
a second protection circuit coupled between the second portion of the first power line and the second power supply pad.

6. The device according to claim 5, wherein the device further comprises a third power supply pad supplied with a third power voltage, and the internal circuit further includes a second power line connected to the third power supply pad.

7. The device according to claim 6, wherein the second and third power voltages are substantially equal to each other.

8. The device according to claim 6, wherein the device further comprises a third protection circuit coupled between the first and third power supply pads.

9. The device according to claim 8, wherein the device further comprises a fourth protection circuit coupled between the second and third power supply pads.

10. A semiconductor device comprising:
first and second power supply pads supplied with first and second power voltages, respectively;
third and fourth power supply pads supplied with third and fourth power voltages, respectively;
a first protection circuit coupled between the first and second power supply pads;
a second protection circuit coupled between the third and fourth power supply pads;
a third protection circuit coupled between the first and fourth power supply pads;
a first internal circuit including first and second power lines and a plurality of first transistors electrically coupled between the first and second power lines, the first power line extending to be connected at a first end portion thereof to the first power supply pad, the second power line extending to be connected at a second end portion thereof to the second power supply pad, the first power line including a first part that is distant from the first end portion;
a second internal circuit including third and fourth power lines and a plurality of second transistors electrically coupled between the third and fourth power lines, the third power line extending to be connected at a third end portion thereof to the third power supply pad, the fourth power line extending to be connected at a fourth end portion thereof to the fourth power supply pad; and
a fourth protection circuit coupled between the first part of the first power line and the fourth power supply pad.

11. The device according to claim 10, wherein each of the first, second, third and fourth protection circuits includes a diode-connected transistor.

12. The device according to claim 10, wherein the second and fourth power voltages are substantially equal to each other.

13. The device according to claim 12, further comprising a fifth protection circuit coupled between the second and fourth power supply pads.

14. The device according to claim 10, wherein:
the second and fourth power voltages are substantially equal to each other;
wherein the first and third power voltages are substantially equal to each other;
the device further comprises a fifth protection circuit coupled between the second and fourth power supply pads; and
each of the first, second, third, fourth and fifth protection circuits includes a transistor of a diode-connected type.

15. The device according to claim 10, wherein:
the first power line further includes a second part between the first end portion and the first part; and
the device further comprises a fifth protection circuit coupled between the second part of the first power line and the fourth power supply pad.

16. The device according to claim 15, further comprising a sixth protection circuit coupled between the second and fourth power supply pads.

17. The device according to claim 10, wherein:
the first power line further includes a second part between the first end portion and the first part and a third part between the first and second parts; and
the device further comprises a fifth protection circuit coupled between the second part of the first power line and the fourth power supply pad and a sixth protection circuit coupled between the third part of the first power line and the fourth power supply pad.

18. The device according to claim 17, further comprising a seventh protection circuit coupled between the second and fourth power supply pads.

19. The device according to claim 10, wherein the first internal circuit comprises one of a delay-locked loop (DLL) circuit and a phase-locked loop (PLL) circuit.

20. The device according to claim 10, wherein the first internal circuit is formed in an area that is surrounded by a deep well region to be electrically isolated from a semiconductor substrate in which the second internal circuit is formed.

* * * * *